(12) United States Patent
El-Khamy et al.

(10) Patent No.: US 8,132,072 B2
(45) Date of Patent: Mar. 6, 2012

(54) SYSTEM AND METHOD FOR PROVIDING H-ARQ RATE COMPATIBLE CODES FOR HIGH THROUGHPUT APPLICATIONS

(75) Inventors: Mostafa El-Khamy, Pasadena, CA (US); Jilei Hou, Carlsbad, CA (US); Naga Bhushan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1115 days.

(21) Appl. No.: 11/480,597

(22) Filed: Jul. 3, 2006

(65) Prior Publication Data

US 2007/0162815 A1 Jul. 12, 2007

Related U.S. Application Data

(60) Provisional application No. 60/756,758, filed on Jan. 6, 2006.

(51) Int. Cl.
*H03M 13/00* (2006.01)

(52) U.S. Cl. ........ 714/755; 714/786; 714/779; 714/788; 714/790

(58) Field of Classification Search .......... 714/752, 714/755, 786, 779, 762, 788, 790
See application file for complete search history.

(56) References Cited

U.S. PATENT DOCUMENTS

| 2004/0153934 | A1* | 8/2004 | Jin et al. ................ 714/746 |
| 2005/0149840 | A1 | 7/2005 | Lee et al. |
| 2006/0294445 | A1* | 12/2006 | Divsalar et al. ........... 714/752 |
| 2007/0022354 | A1 | 1/2007 | Yu et al. |

FOREIGN PATENT DOCUMENTS

| EP | 1596501 | 11/2005 |
| EP | 1699139 | 9/2006 |
| EP | 1724932 | 11/2006 |
| KR | 20030007846 | 1/2003 |
| KR | 200535729 | 4/2005 |
| KR | 2005118056 | 12/2005 |
| WO | WO0193431 | 12/2001 |
| WO | 04114526 | 2/2004 |

OTHER PUBLICATIONS

Andrews K. et al: "Design of low-density parity-check (LDPC) codes for deep-space applications" Interplenetary Network (IPN) Progress Report, Nov. 15, 2004, pp. 1-14, XP002454100.

(Continued)

*Primary Examiner* — Guy Lamarre

(74) *Attorney, Agent, or Firm* — Jeffrey D. Jacobs; Larry J. Moskowitz

(57) ABSTRACT

In one embodiment, the present patent application comprises a method and apparatus to generate low rate protographs from high rate protographs, comprising copying a base graph; permuting end points of edges of a same type in copies of the base graph to produce a permuted graph; and pruning systematic input nodes in the permuted graph and the edges connected to them. In another embodiment, the present patent application comprises a method and apparatus to generate high-rate codes from low-rate codes, comprising puncturing a subset of codeword bits, wherein the step of puncturing a subset of codeword bits comprises regular-irregular puncturing the subset of codeword bits, random puncturing variable nodes, or progressive node puncturing variable nodes to obtain a desired code from a preceding code.

36 Claims, 26 Drawing Sheets

OTHER PUBLICATIONS

Divsalar D et al: "Low-rate LDPC codes with simple protograph structure" Proc., IEEE International Symposium on Information Theory, ISIT 2005, Adelaide, Australia, Sep. 4, 2005-Sep. 9, 2005, pp. 1622-1626, XP010845825.

Divsalar D et al: "Protograph based LDPC codes with minimum distance linearly growing with block size" Proc., IEEE Conference on Global Telecommunications, GLOBECOM 2005, St. Loius, MO, USA, Nov. 28, 2005-Dec. 4, 2005, pp. 1152-1156, XP010881380.

Dolinar S: "A rate-compatible family of protograph-based LDPC codes built by expurgation and lengthening" Proc., IEEE International Symposium on Information Theory, ISIT 2005, Adelaide, Australia, Sep. 4, 2005-Sep. 9, 2005 pp. 1627-1631, XP010845826.

Eoiyoung Choi et al: "Rate-compatible puncturing for Low-density Parity-Check codes with dual-diagonal parity structure" Proc., IEEE 16th International Symposium on Personal, Indoor and Mobile Radio Communications, PIMRC 2005, Berlin, Germany, Sep. 11, 2005, Sep. 14, 2005 pp. 2642-2646, XP010928170.

Ha J et al: "Rate-compatible puncturing of low-density parity-check codes" IEEE Transactions on Information Theory, vol. 50, No. 11. Nov. pp. 2824-2836, XP011121167.

International Search Report—PCT/US07/060249, International Search Authority—European Patent Office—Nov. 13, 2007.

Jeongseok Ha et al: "Optimal puncturing of irregular low-density parity-check codes" Proc., IEEE International Conference on Communication, ICC 2003, Anchorage, AK, vol. vol. 1 of 5, May 11, 2003-May 15, 2003 pp. 3110-3114, XP010643019.

Klinc D et al: "Rate-compatible punctured low-density parity-check codes for ultra wide band systems" Proc., IEEE Conference on Global Telecommunications, GLOBECOM '05, St. Loius, MO, USA, Nov. 28, 2005-Dec. 2, 2005, pp. 3856-3860, XP010881470.

Li J and Narayanan K R: "Rate-compatible low density parity check codes for capacity-approaching ARQ schemes in packet data communications" Proc., Iasted International Conference on Communications, Internet and Information Technology, Nov. 18, 2002, pp. 201-206, XP002339009.

Mackay D J C: "Good error-correcting codes based on very sparse matrices" IEEE Transactions on Information Theory, vol. 45, No. 2, Mar. 1999, pp. 399-431, XP002143042.

Richardson T.J. et al: "The capacity of low-density parity-check codes under message-passing decoding" IEEE transactions on information theory, IEEE Service Center, Piscataway, NJ, US, vol. 47, No. 2, Mar. 2001 XP011027878.

Tao Tian et al: "Rate-compatible low-density parity-check codes" Proc., IEEE International Symposium on Information Theory, ISIT 2004, Chicago, IL, USA Jun. 27, 2004-Jul. 2, 2004, pp. 153, XP010749864.

Thorpe J et al: "Methodologies for designing LDPC codes using protographs and circulants" Proc., IEEE Symposium on Information Theory, ISIT 2004, Chicago, Illinois, USA, Jun. 27, 2004-Jul. 2, 2004, pp. 236-236, XP010749947.

Wilson S G: "Linear block codes" Digital Modulation and Coding, 1996, pp. 411-425, 470, XP002275914.

Yang M et al: "Performance of efficiently encodable low-density parity-check codes in noise bursts on the EPR4 channel" IEEE Transactions on Magnetics, vol. 40, No. 2, Mar. 1, 2004, pp. 507-512, XP002339008.

Yazdani M et al: "On construction of rate-compatible low-density parity-check codes" Proc., IEEE International Conference on Communications, ICC 2004, Paris, France, Jun. 20, 2004-Jun. 24, 2004 pp. 430-434, XP010710382.

Hossein et al., "Results on Punctured LDPC Codes," ITW 2004, Oct. 24-29, 2004.

D. Divsalar, C. Jones, "Protograph based low error floor LDPC coded modulation," IEEE Military Communications Conference, 2005. MILCOM 2005, vol. 1 pp. 378-385.

El-Khamy M., et al., "H-ARQ rate-compatible structured LDPC codes", Proc., IEEE International Symposium on Information Theory, ISIT 2006, Seattle, USA, Jul. 9, 2006-Jul. 14, 2006, pp. 1134-1138.

European Search Report—EP11151557—Search Authority—Munich—Mar. 3, 2010

European Search Report—EP11151564—Search Authority—Munich—Mar. 30, 2011.

Abbasfar, A. et al., "Accumulate Repeat Accumulate Coded Modulation," 2004 IEEE Military Communications Conference, pp. 169-174, Jul. 2, 2004.

European Search Report—EP11151561—Search Authority—Munich—Apr. 15, 2011.

Xiao-Yu Hu, et al., "Progressive Edge-Growth Tanner Graphs," Proceedings of the Global Telecommunications Conference, 2001. GLOBECOM' 01, Nov. 25, 2001, vol. 2, pp. 995-1001.

* cited by examiner

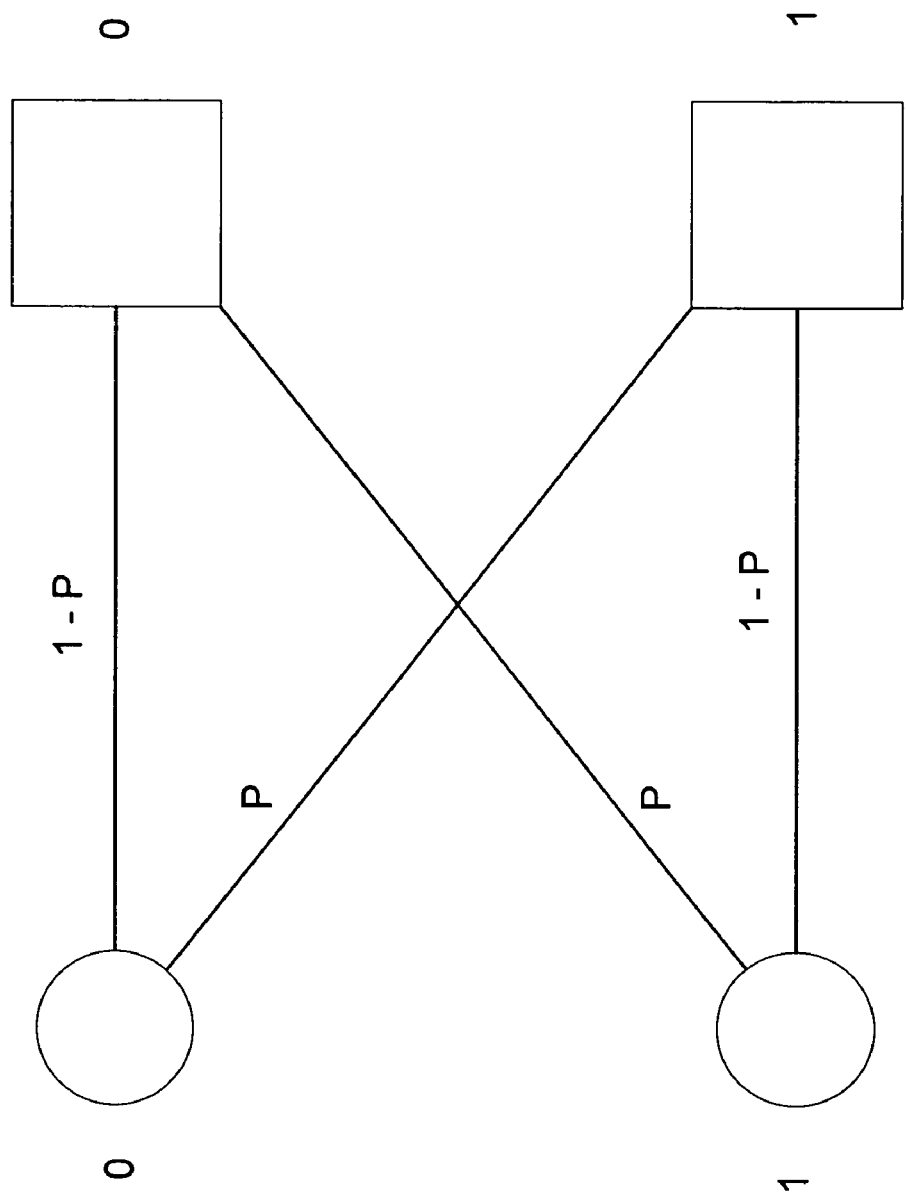

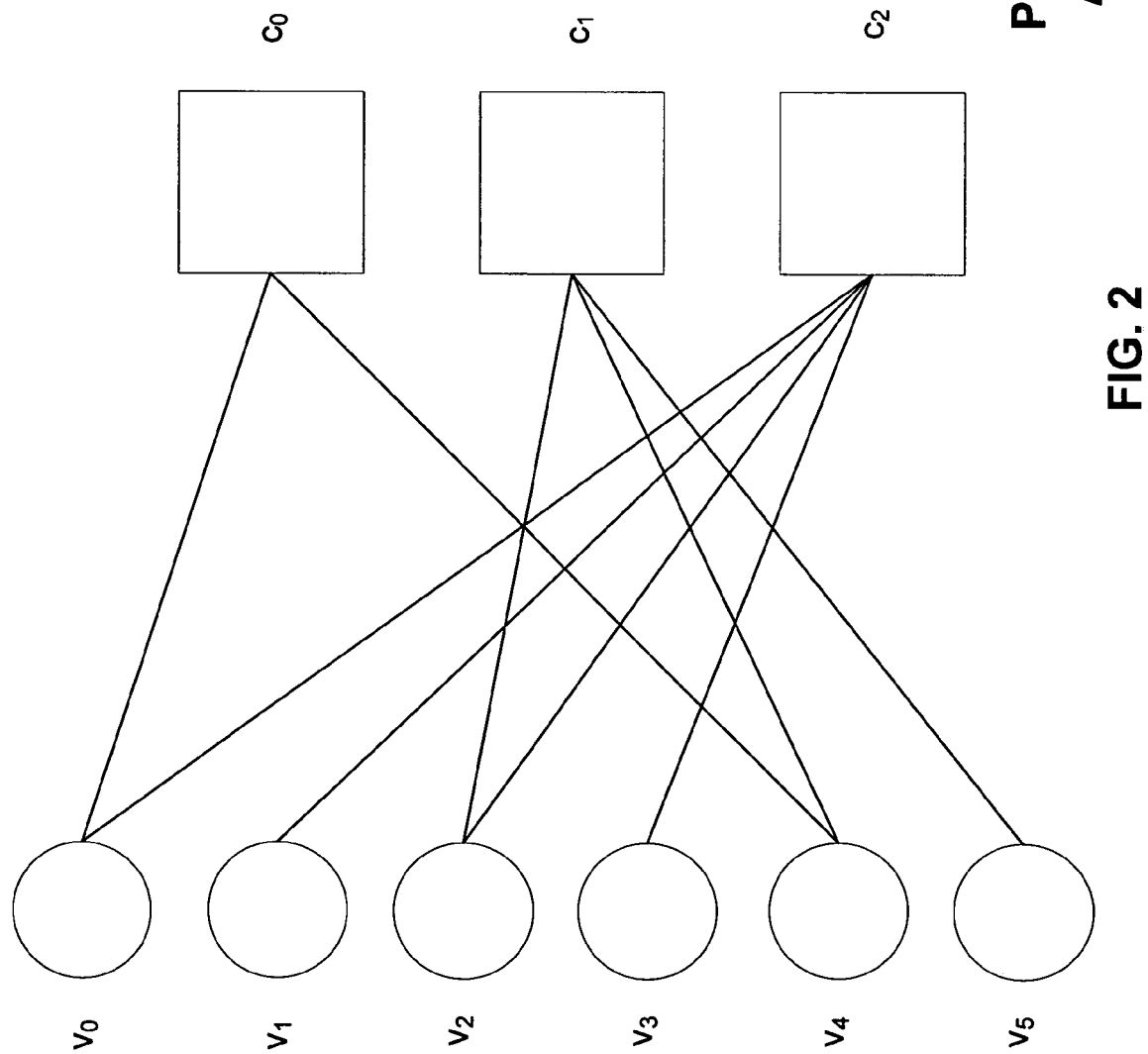

|       | $c_0$ | $c_1$ | $c_2$ |
|-------|-------|-------|-------|
| $v_0$ | 1     | 0     | 1     |
| $v_1$ | 0     | 0     | 1     |
| $v_2$ | 0     | 1     | 1     |
| $v_3$ | 0     | 0     | 1     |
| $v_4$ | 1     | 1     | 0     |
| $v_5$ | 0     | 1     | 0     |

PRIOR ART

FIG. 3

SYSTEM AND METHOD FOR PROVIDING H-ARQ RATE COMPATIBLE CODES FOR HIGH THROUGHPUT APPLICATIONS

This application claims benefit of U.S. Provisional Application No. 60/756,758 titled "System and Method for Providing H-ARQ Rate Compatible Codes for High Throughput Applications" filed Jan. 6, 2006, the entire disclosure of this application being considered part of the disclosure.

BACKGROUND

1. Field

The present invention generally relates to communication and, in particular, to hybrid automatic request (H-ARQ) rate compatible coding for high throughput applications.

2. Background

Generally, in the case of data transmission, a receiver observes each received bit in the presence of noise or distortion and only an indication of the bit's value is obtained. Under these circumstances one interprets the observed values as a source of "soft" bits. A soft bit indicates a preferred estimate of the bit's value, i.e., a one or a zero, together with some indication of that estimate's reliability. While the number of errors may be relatively low, even a small number of errors or level of distortion can result in the data being unusable or, in the case of transmission errors, may necessitate re-transmission of the data.

In order to provide a means to check for errors and, in some cases, to correct errors, binary data can be coded to introduce carefully designed redundancy. Coding of a unit of data produces what is commonly referred to as a codeword. Because of its redundancy, a codeword will often include more bits than the input unit of data from which the codeword was generated.

When signals arising from transmitted codewords are received or processed, the redundant information included in the codeword as observed in the signal can be used to identify and/or correct errors in or remove distortion from the received signal in order to recover the original data unit. Such error checking and/or correcting can be implemented as part of a decoding process. In the absence of errors, or in the case of correctable errors or distortion, decoding can be used to recover from the source data being processed, the original data unit that was encoded. In the case of unrecoverable errors, the decoding process may produce some indication that the original data cannot be fully recovered. These decoding failure indications of decoding failure can be used to initiate retransmission of the data.

Communication systems often need to operate at several different rates. One way to keep the implementation as simple as possible and to provide for the coding and decoding at the different rates is to use low-density-parity check (LDPC) codes. In particular, the LDPC codes are used to generate higher-rate codes by puncturing lower-rate codes. With communication systems that employ rate adaptation, the transmission data rate may need to be adjusted according to the conditions and demands of the system. Rate adaption allows a communication system, and the components thereof, to flexibly and efficiently adapt the data rate to the current channel conditions. Typical error correcting designs, for example, select a fixed code, the code having a certain rate and correction capability. To add flexibility for handling different amounts of data having different error protection requirements, the rate is adapted to time-varying channel conditions, as well as compensating for insufficiently known parameters.

For flexible channel encoding, the data bits may be grouped into blocks of varying size, and these blocks may be encoded with different amounts of redundancy. Instead of using several separate error correcting codes to encode the different groups of bits, it is desirable to use a single parent code that may accommodate several rates. This is referred to as rate-compatible coding. With the rapid development of mobile communication systems, there remains a need in the art for rate-compatible LDPC codes suitable for hybrid ARQ applications with high throughput.

LDPC methods can recover codewords in very noisy environments. Two examples of communication channel models are the binary erasure channel (BEC) and the binary symmetric channel (BSC). These channels are illustrated in FIGS. 1A and 1B. The input is binary in that it is comprised of bits having the value 0 or 1.

With respect to outputs, the BEC has an output of 0, 1 or erasure. The probability that a bit was transferred correctly is $1-p$, and the probability that a bit was erroneously transferred, i.e., erased, is p. With BSC, the output is 0 or 1. The probability that a bit was transferred correctly is $1-p$, and the probability that a bit was erroneously transferred, i.e., a zero was received when a one was sent and vica versa, is p.

LDPC codes are linear codes which are generated from sparse bipartite graphs. A bipartite graph, also called a bigraph, is a set of graph vertices decomposed into two disjoint sets such that no two graph vertices within the same set are adjacent. A bipartite graph is a special case of a k-partite graph with k=2. If there are p and g graph vertices in the two sets, the complete bipartite graph is denoted $K_{p,q}$. By sparse we mean that the LDPC code is a special class of linear block codes whose parity check matrix H has a low density of ones. This sparsity renders low complexity decoding leads to simple implementation. FIG. 2 is an example of such a graph. The graph contains V variable nodes, $v_i$ on the left and C check nodes, $c_j$ on the right. The V variable nodes may also be called message or systematic nodes.

The bipartite graph may be represented by a simplified adjacency matrix. H with C rows and V columns. See FIG. 3. FIG. 3 is an example of a binary sparse C×V parity check matrix H. If a j-th check node is connected to an i-th variable node by an edge, i.e., the two nodes are neighbors, then there is a one in the i-th column and in the j-th row of a parity check matrix H. That is, the intersection of an-i-th row and a j-th column contains a "1" where an edge joins the corresponding vertice and a "0" where there is no edge. A variable node and a constraint (or check) node are said to be neighbors if they are connected by an edge in the graph. Edges, E, in the graph connect variable nodes to constraint or check nodes and each edge corresponds to a non-zero entry in the parity check matrix. Each row of matrix H corresponds to a check node and represents a parity check and each column corresponds to one of the variable nodes and represents a demodulated symbol. Since there are 5 variable nodes and 3 check nodes, the matrix includes 5 columns and 3 rows.

The number of demodulated symbols or variable nodes N is the LDPC code length. The number of non-zero elements in a row (column) is defined as the row (column) weight $d_c(d_v)$. A regular graph or code is one for which all variable nodes have the same degree, j say, and all constraint nodes have the same degree, k say. In this case we say that the code is a (j,k) regular code. On the other hand, an irregular code has constraint nodes and/or variable nodes of differing degrees. For example, some variable nodes may be of degree 4, others of degree 3 and still others of degree 2.

To each variable node is associated one bit of the codeword. A bit sequence associated one-to-one with the variable node sequence is a codeword of the code if and only if, for each constraint node, the bits neighboring the constraint (via their association with variable nodes) sum to zero modulo two, i.e., they comprise an even number of ones. In some cases some of these bits might be punctured or known, as discussed further below. Puncturing is the act of removing bits from a codeword to yield, in effect, a shorter codeword. In the case of LDPC graphs this means that some of the variable nodes in the graph correspond to bits that are not actually transmitted.

The decoders and decoding algorithms used to decode LDPC codewords operate by exchanging messages within the graph along the edges and updating these messages by performing computations at the nodes based on the incoming messages. Such methods will be generally referred to as message passing methods. Each variable node in the graph is initially provided with a soft bit, termed a received value, that indicates an estimate of the associated bit's value as determined by observations from, e.g., the communications channel. Ideally, the estimates for separate bits are statistically independent. This ideal may be violated in practice. A received word is comprised of a collection of received values.

The degree of a node refers to the number of edges connected to that node. This feature is illustrated in the H matrix shown in FIG. 3 where the number of edges incident to $v_i$ is equal to the number of ones in column i and is called the variable node degree $d(v_i)$. Similarly, the number of edges connected with $c_j$ is equal to the number of ones in row j and is called the check node degree $d(c_j)$.

In hybrid ARQ applications, all the data symbols are transmitted during the first transmission with a high rate code. If the packet was not successfully decoded, the transmitter would send more redundancy symbols to increase the reliability of the already transmitted packet. These redundancy symbols when combined with the previously received packet make another codeword of a relatively lower rate since information bits are punctured by the added redundancy symbols. The transmitter will incrementally send redundancy symbols, thus decreasing the overall rate of the transmitted packet until the receiver acknowledges the successful decoding of the packet. Rate-compatible structured LDPC codes in the prior art may have the undesired property that the information block size at the protograph level is not constant which may make them unsuitable for H-ARQ applications. In addition, in the prior art, low-rate structured LDPC codes may have the undesired property that the punctured variable nodes have very high degrees. Therefore, it may be difficult to puncture them to achieve high rates.

SUMMARY OF THE INVENTION

In view of the above, the described features of the present invention generally relate to one or more improved systems, methods and/or apparatuses for communicating speech.

In one embodiment, the present patent application comprises a method and apparatus to generate low rate protographs from high rate protographs, comprising copying a base graph; permuting end points of edges of a same type in copies of the base graph to produce a permuted graph; and pruning systematic input nodes in the permuted graph and the edges connected to them.

In another embodiment, the present patent application comprises a method and apparatus to generate high-rate codes from low-rate codes, comprising puncturing a subset of codeword bits, wherein the step of puncturing a subset of codeword bits comprises regular-irregular puncturing the subset of codeword bits, random puncturing variable nodes, or progressive node puncturing variable nodes to obtain a desired code from a preceding code.

Further scope of the applicability of the present method and apparatus will become apparent from the following detailed description, claims, and drawings. However, it should be understood that the detailed description and specific examples, while indicating preferred embodiments of the invention, are given by way of illustration only, since various changes and modifications within the spirit and scope of the invention will become apparent to those skilled in the art.

BRIEF DESCRIPTION OF THE DRAWINGS

The features, objects, and advantages of the presently disclosed method and apparatus will become more apparent from the detailed description set forth below when taken in conjunction with the drawings in which like reference characters identify correspondingly throughout and wherein:

FIG. 1B is an example of a Binary Symmetric Channel (BSC) with error probability p;

FIG. 2 is an example of a bipartite graph;

FIG. 3 is an example of a binary sparse M×N parity check matrix H;

FIG. 17 is a functional block diagram illustrating an embodiment of an access terminal; and.

DETAILED DESCRIPTION

Figure 1A:
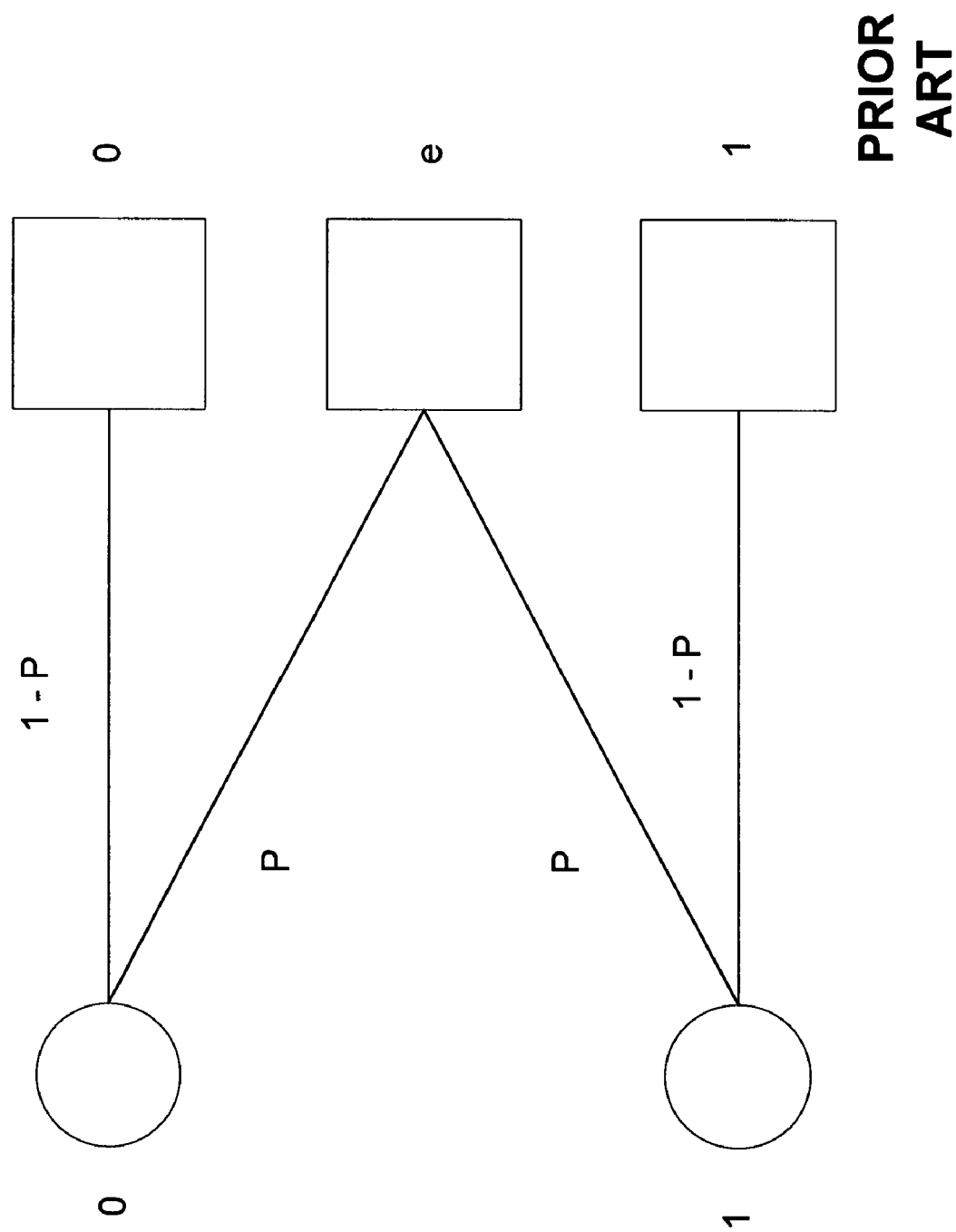
FIG. 1A is an example of a Binary Erasure Channel (BEC) with erasure probability p.

The word "exemplary" is used herein to mean "serving as an example, instance, or illustration." Any embodiment described herein as "exemplary" is not necessarily to be construed as preferred or advantageous over other embodiments.
Generating Low Rate Protographs from High Rate Protographs In a first embodiment, the patent application comprises a systematic method of low complexity for generating structured low-rate LDPC codes. These low-rate codes may outperform standard turbo codes and may have an inherent structure amenable for high-speed parallel decoding. These codes have a good performance on the average white Gaussian noise (AWGN) channel and are robust against erasures and puncturing. That is, these low rate structured LDPC codes may have low thresholds on the AWGN channel as well as a good performance on the erasure channel. These codes are also suitable for high throughput applications. These codes may serve as a parent code in a rate compatible family for use in hybrid ARQ applications.

Starting from a protograph 10 with a relatively high rate, the present patent application discloses a systematic method for constructing protographs 10 of lower rates. The low rate protograph 10 is derived from a higher rate one using a copy-and-permute approach in which a larger protograph 10 (i.e., the low rate protograph 10) is constructed from the high rate one (or base graph 12) using progressive edge growth (PEG) to maximize the girth of the protograph 10 as well as improving its extrinsic cycle information criterion. This is then followed by pruning a calculated number of input nodes 20 and the edges 15 connected to them to reach the desired rate. Based on density evolution on the AWGN and erasure channels, the protograph 10 can be then further optimized by adding/swapping a very small number of edges 15 in the protograph 10. (Density evolution analysis is a method known in the art which may be carried out on a protograph 10 to determine whether or not decoding will yield arbitrarily small bit-error probability on a large derived graph 10. In this technique, the messages that are defined in the message-passing method are treated as random variables, and their distributions are computed).

A protograph 10 may be any bipartite graph. However, it is typically one with a small number of nodes. A typical protograph 10 consists of a set of message or variable nodes 20, a set of check nodes 25, and a set of edges 15. Each edge 15 connects a variable node 20 to a check node 25. Furthermore, parallel edges 15 are permitted, so the mapping may no be 1:1.

Figure 4:
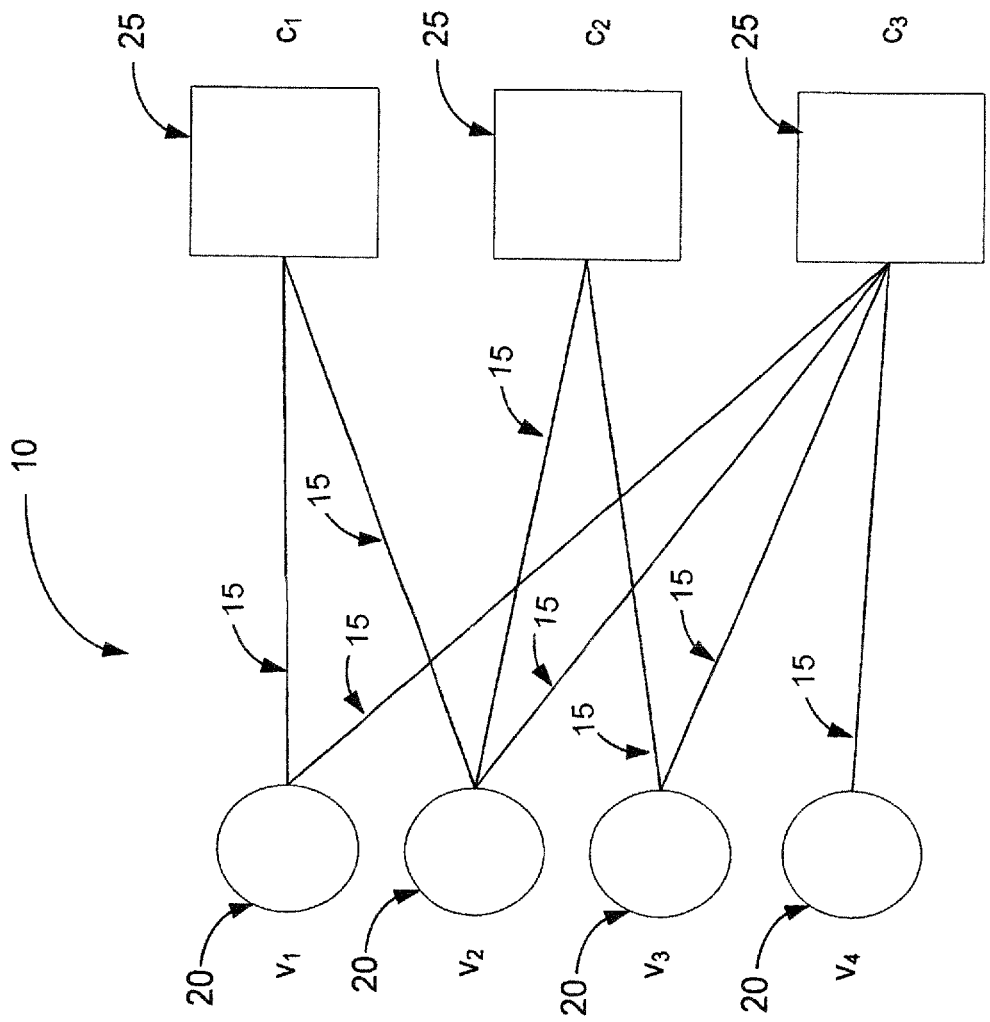
FIG. 4 is an example of a protograph consisting of V=4 variable nodes and C=3 check nodes, connected by E=8 edges.

As a simple example, we consider the protograph 10 shown in FIG. 4. This graph consists of V=4 variable nodes 20 and C=3 check nodes 25, connected by E=8 edges 15. The 4 variable nodes 20 in the protograph are denoted by "$v_1, v_2, v_3, v_4$," and the three check nodes by "$c_1, c_2, c_3$." By itself, this graph 10 may be recognized as a bipartite graph of an (n=4, k=1) LDPC code, in this case a repetition code, where k and n are the length of the information blocks and the codewords respectively. The bipartite graph of FIG. 4 is used to determine an irregular LDPC code of length four and rate one-quarter. Length four indicates that there are four variable nodes 20 $v_1, v_2, v_3, v_4$, each identified with one bit of the codeword $x_1, x_2, x_3, x_4$, (and no puncturing in this case). Rate one-quarter indicates that there are three check nodes 25 to four variable nodes 20.

On advantage of the present method and apparatus is that the resulting protographs 10 do not have a high degree of punctured variable nodes V 20 with high connectivity. Another advantage is that the complexity of designing the protograph 10 is low. We can obtain codes which are suitable for both puncturing and extending to construct H-ARQ rate compatible codes. The structure of the code, results in inherent parallelism and fast decoding structures and high throughput. The resulting protograph 10 is structured and can be expressed in terms of accumulators, repeaters, and permuters which result in fast encoding structures.
Generating Good Low Rate Codes from Base Codes of Higher Rate:

When generating these codes, the following assumptions are made:

The base protograph B has N variable nodes 20 and C check nodes 25. $N_t$ of the variable nodes 20 are punctured (hidden).

The number of variable nodes 20 and check nodes 25 in base graph B 12 is N and C respectively.

The base graph B 12 has N–C systematic input nodes 20 and $N_t$ punctured redundancy nodes 20, where K=N–C. That is, there are $N_t$ is the number of punctured variable nodes 20 in the protograph B.

The rate of the base (high rate) protograph is $R_B$=K/(N–$N_t$).

Figure 5A:
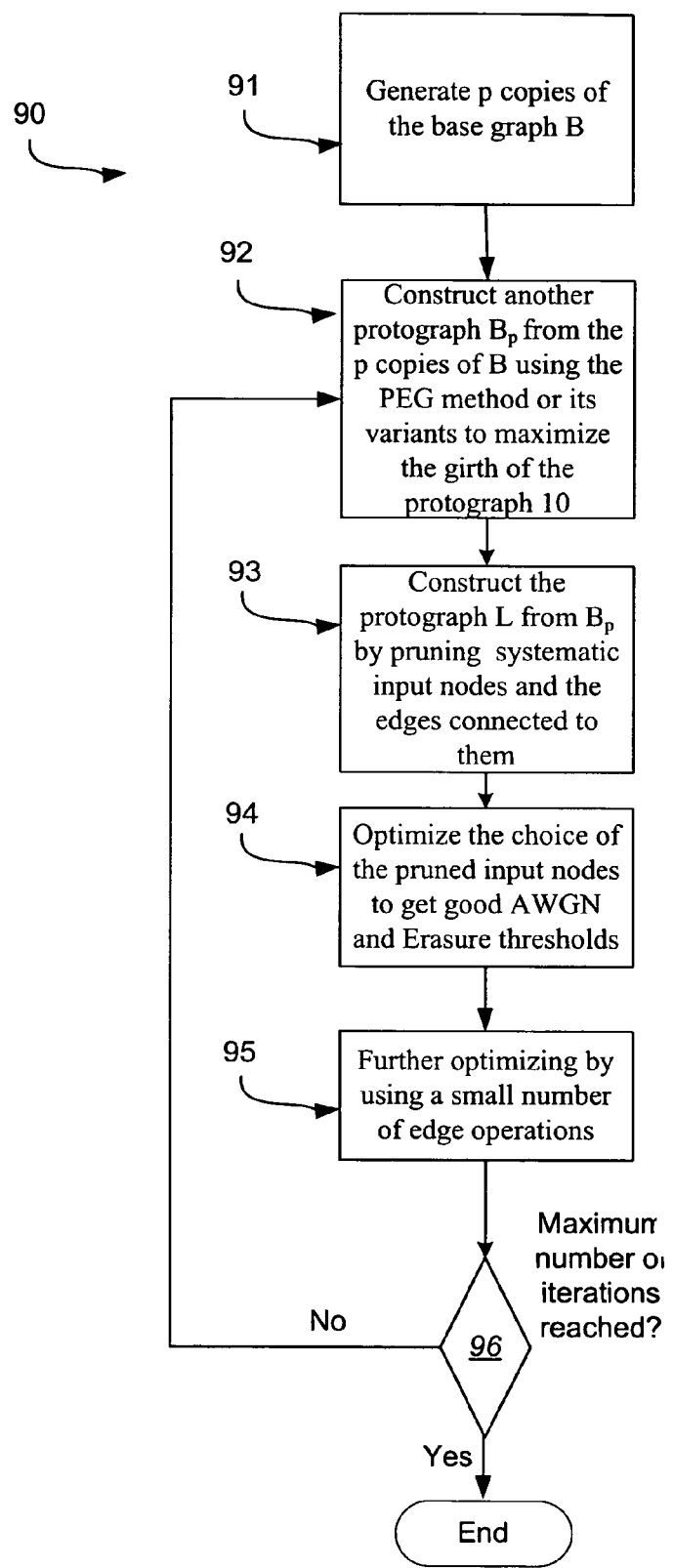
FIG. 5A is a flowchart which illustrates the steps that are executed when generating low rate protographs from high rate protographs.

FIG. 5A is a flowchart which illustrates the following the steps that are executed when generating low rate protographs 10 of rate $R_L$ from high rate protographs 10 of rate $R_B$ (90):

Generate p copies of the base graph 12 B (Step 91).

Construct another protograph 10 $B_p$ from the p copies of B using the PEG method or its variants to maximize the girth of the protograph 10 (Step 92).

Construct the protograph 10 L from $B_p$ by pruning $$pK \frac{R_B - R_L}{R_B(1 - R_L)}$$

systematic input nodes 20 and the edges 15 connected to them 10 (Step 93).

Optimize the choice of the pruned input nodes 20 to get good AWGN and Erasure thresholds (Step 94).

Further optimization can be done by using a small number of edge 15 operations such as adding, removing and swapping said edges 15 of said pruned permuted graph 10 (Step 95).

The PEG method and its variants may have some randomness in them. In such case, the PEG construction may be repeated until a maximum number of iterations is reached (Step 96). That is, repeat steps 92-95 until a maximum number of iterations is reached.

The following is a description of a special case of the method where the following assumptions are made:

The rate of a base graph 12, B, is 0.5.

The design rate is 1/m (1/m<½) (m is introduced to avoid confusion with n which is the length of the code).

Figure 5B:
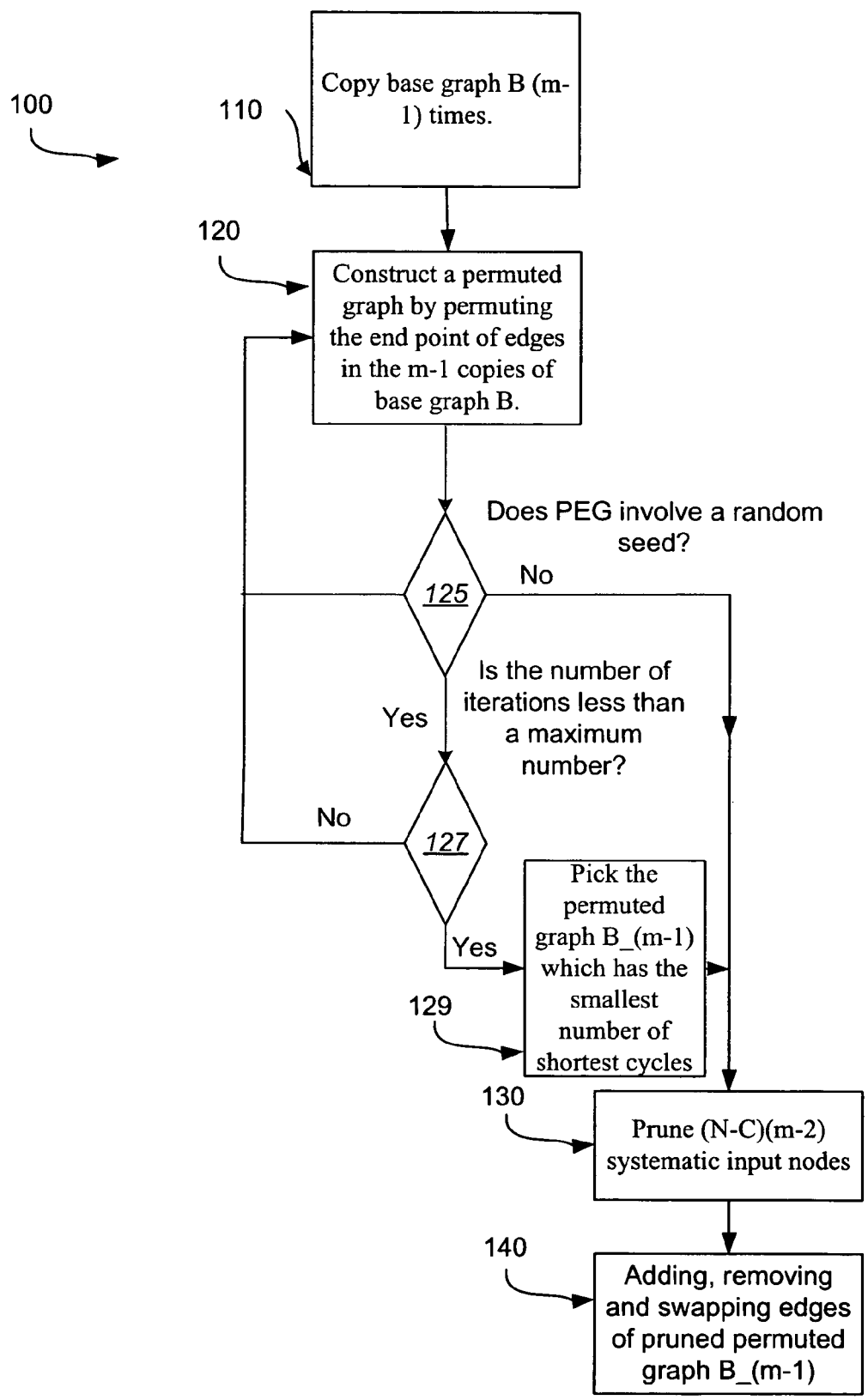
FIG. 5B is a flowchart which illustrates the steps that are executed when generating low rate protographs from high rate protographs where the design rate is 1/m.
Figure 6:
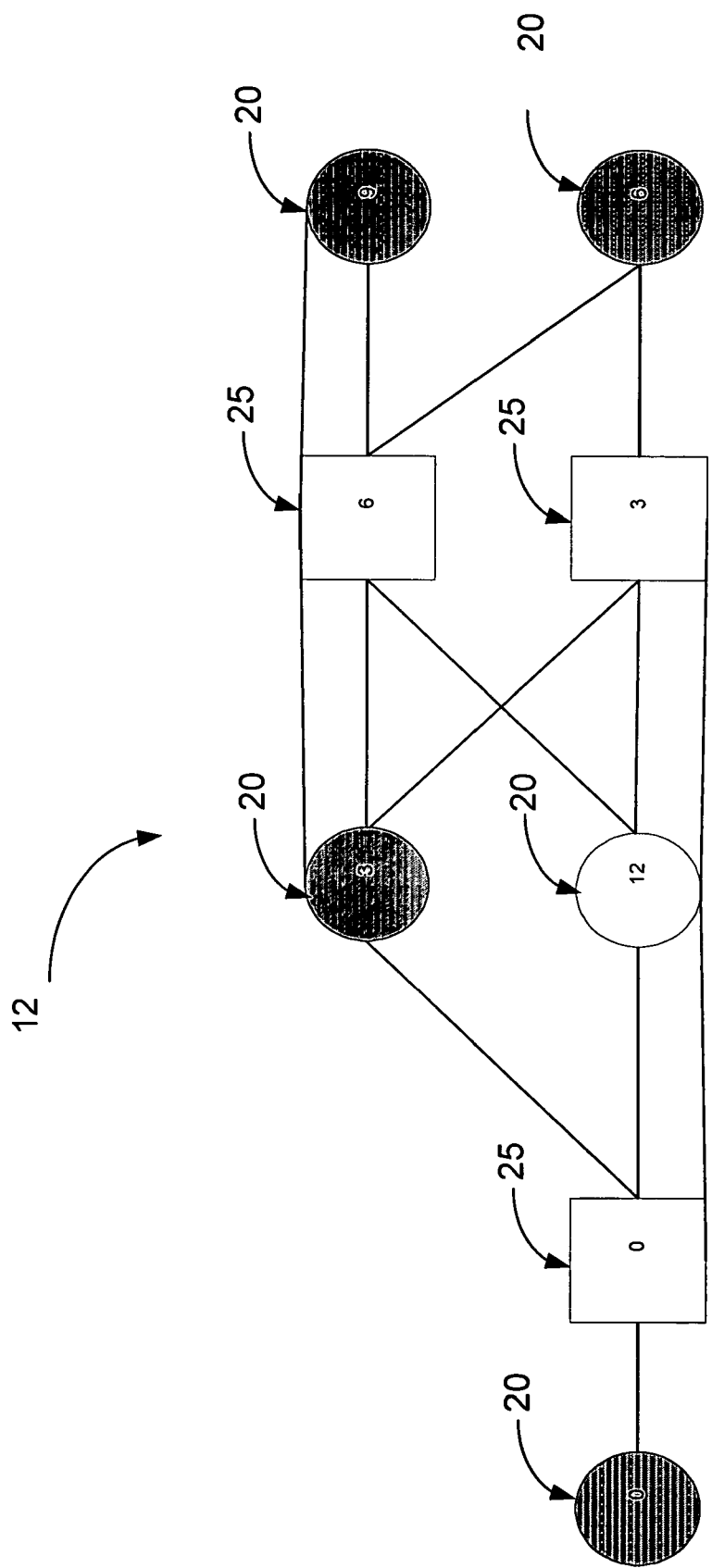
FIG. 6 illustrates an example of a base graph B.
Figure 7:
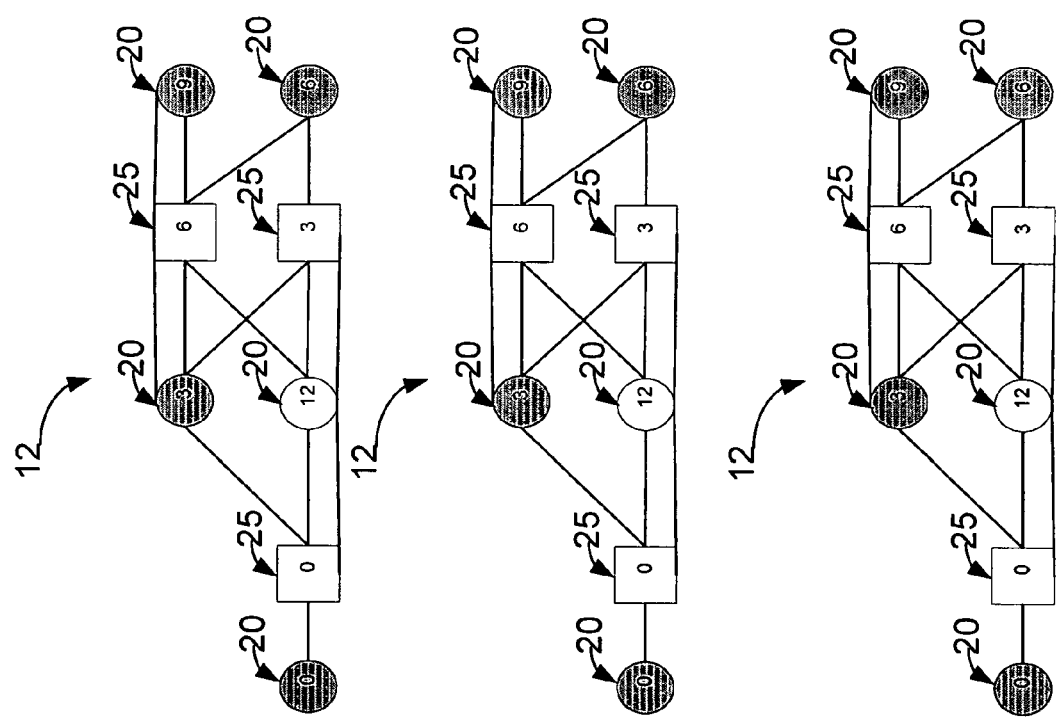
FIG. 7 illustrates n−1 copies of the base graph, B, where n=4.

FIG. 5B is a flowchart which illustrates the following the steps that are executed when generating low rate protographs 10 from high rate protographs 10 (100):

Step 110—Copy the base or parent graph 12, B, m−1 times. FIG. 6 illustrates an example of a base graph B 12. FIG. 7 illustrates m−1 copies of base graph B 12, where m=4.

Step 120—Construct a permuted graph B_(m−1) 14 by permuting the end points of edges 15 of the same type in the n−1 copies of base graph B 12. FIG. 6 illustrates this step. In one embodiment, the permutation of the edges 15 is implemented using the progressive edge growth (PEG) method to maximize the girth of the graph 14. Progressive edge growth involves establishing edges 15 or connections between variable (or symbol) nodes 20 and check nodes 25 in an edge-by-edge manner. The fundamental idea is to find the most distant check node 25 and then to place a new edge 15 connecting the symbol node 20 and the most distant check node 25. In step 120, the PEG method was used to construct the permuted graph B_(m−1) 14. Other variations of the PEG method could be used to permute the edges such the ACE-PEG method, Circulant-PEG or Circulant-ACE-PEG methods.

The following is an explanation of girth. If two vertices x and y in the graph are connected, their distance d(x,y) is then defined as the length (number of edges) of the shortest path joining them. A closed path with edges 15 starting from x and ending at x is called a cycle of x. Girth g refers to the shortest cycle in a graph).

As a simple example illustrating steps 110, and 120, we consider the base graph 12 shown in FIG. 6. This graph consists of N=5 variable nodes 20 represented by circles and C=3 check nodes 25 represented by square boxes. The variable nodes 20 and check nodes 25 are connected by E=14 edges 15. By itself, this graph may be recognized as the Tanner graph of an (n=5, k=2) LDPC code, where k=N−C.

For a target rate of ¼, m=4. We can obtain a larger graph by a copy-and-permute operation, illustrated in FIGS. 7 and 8. In FIG. 7, the base graph B 12 of FIG. 6 has been copied three times (m−1=3). Here, the three copies are overlaid so that same-type vertices are in close proximity, but the overall graph consists of three disconnected subgraphs.

Figure 8:
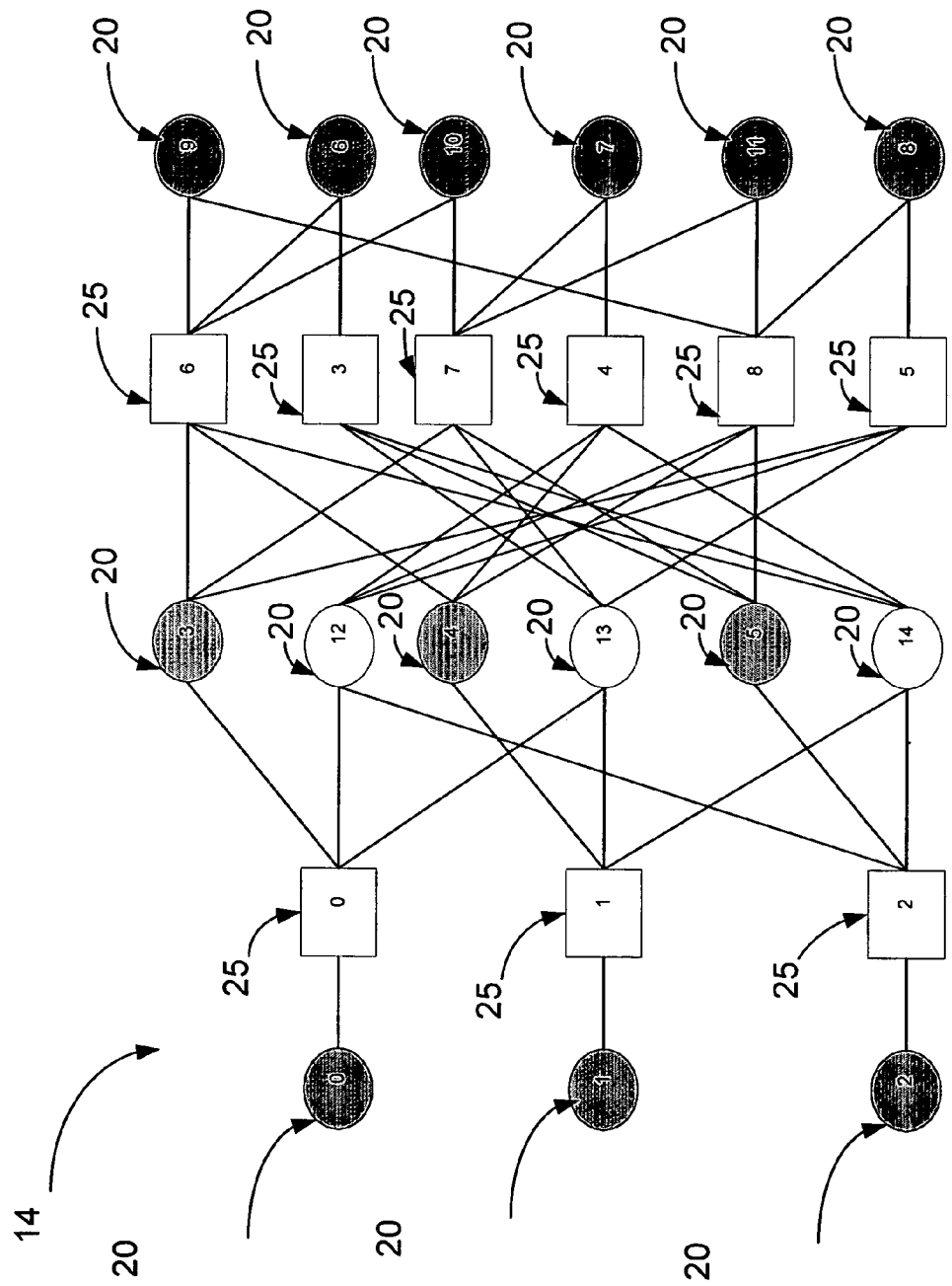
FIG. 8 illustrates base graph B_(n−1) which was generated by permuting the end points of edges of the same type in the n−1 copies of base graph B.

In FIG. 8, the endpoints of the three copies of each edge 15 in the base graph 12 have been permuted among the three copies of the corresponding variable nodes 20 and check nodes 25. After this swapping of endpoints of edges 15, the three base graphs 12 are now interconnected to produce permuted graph B_(m−1) 14.

Step 125—If the PEG method involves a random seed, repeat the previous step for a limited number of iterations (i.e., a maximum number of iterations has been reached (step 127)) and pick the permuted graph B_(m−1) 14 which has the smallest number of shortest cycles (with the largest girth) (step 129).

Figure 9:
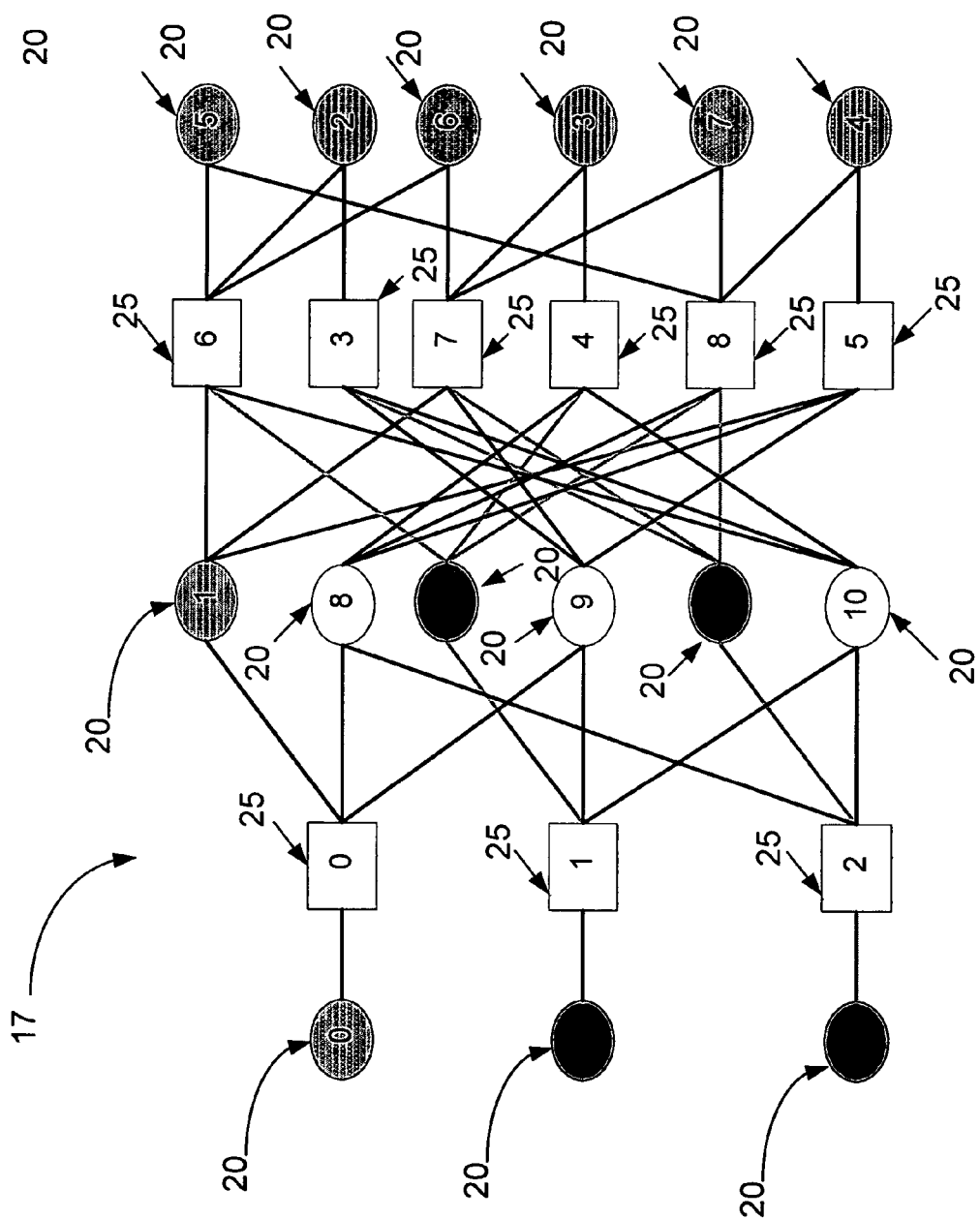
FIG. 9 illustrates a pruned version of permuted graph B_(n−1)

Step 130—Prune (N−C)(m−2) systematic input nodes 20 in permuted protograph B_(m−1) 14 and the edges 15 connected to them to get another protograph, P 17. See FIG. 9 which illustrates a pruned version of permuted graph B_(m−1) 14 in which 4 systematic (or variable) nodes 20 were pruned. The pruned nodes contain no numbers, i.e., they are blank. As stated above, m=4, N=5 variable nodes 20 and C=3 check nodes 25 and K=5−3=2. Therefore, (N−C)(m−2)=(5−3)(4−2)=(2)(2)=4. In step, 130, the present method and apparatus prunes a total of (N−C)(m−2) of the systematic input nodes 20. These nodes are usually chosen as any (m−2) copies of the systematic nodes 20 in the base protograph B 12. In most cases, the choice of the copies that are pruned does not affect the performance due to the symmetry in the protograph B_(m−1) 14 across these copies. However, if no such symmetry exists, it is feasible to try all possible (N−C)(m−2) combinations of systematic input nodes 20 and pick the combination that will give the lowest threshold. This is due to the small size of the protograph 10, which makes the search of the threshold of the protograph 10 using a density evolution a fast process. Moreover, one could choose the pruned input systematic nodes 20 at random while using a gradient descent or simulated annealing approach.

Figure 10:
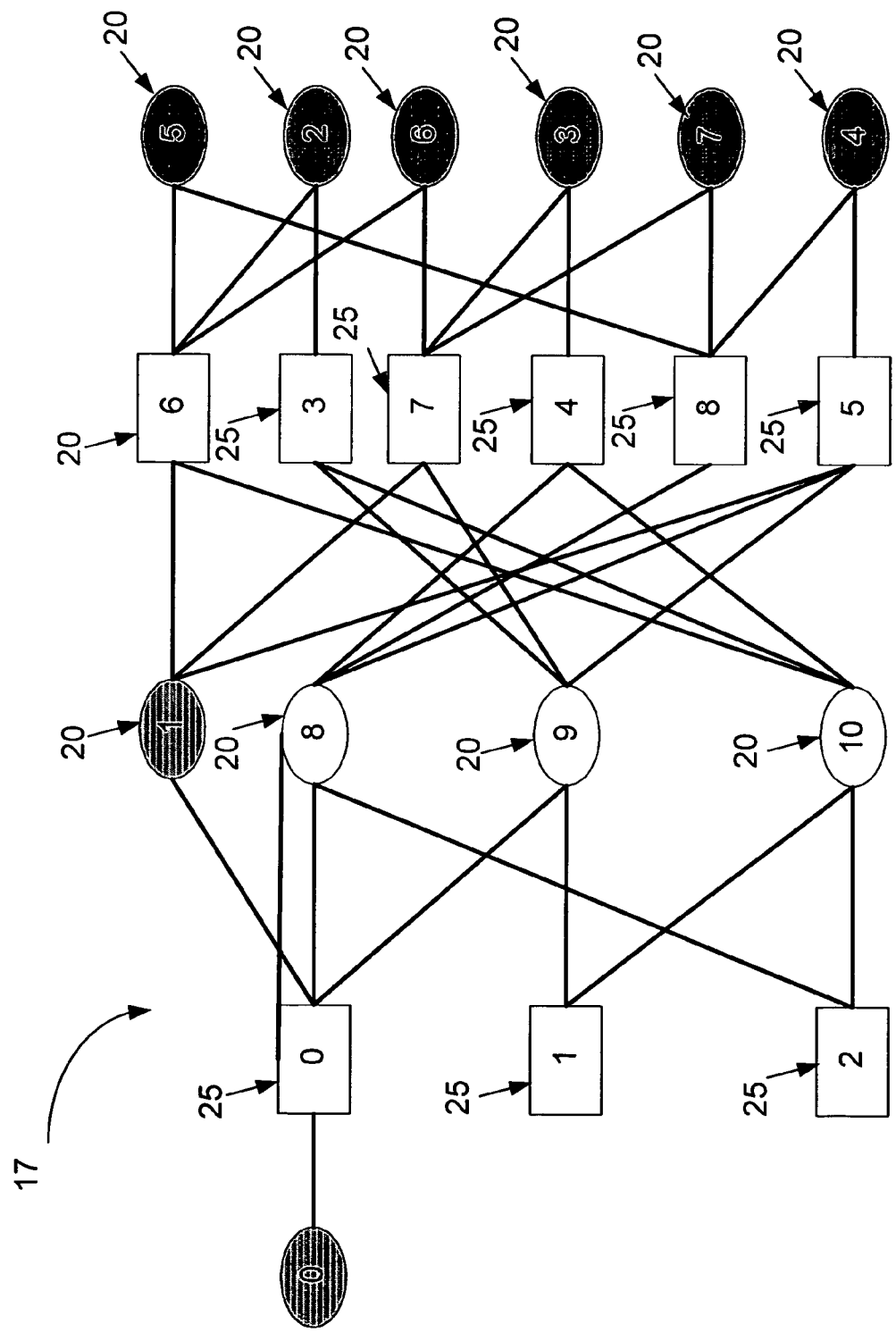
FIG. 10 illustrates optimizing permuted graph B_(n−1) by adding an edge from check node 0 to variable node 8.

Step 140—Since permuted, pruned graph P 17 is a protograph 10 of a rate 1/m code, additional optimization of the 10 protograph is done by adding, removing and swapping edges 15 of pruned, permuted graph P 17. See FIG. 10 which illustrates optimizing pruned, permuted graph P 17 by adding an edge 15 from check node 0 to variable node 8.

In step 140, carefully adding a very small number of edges 15 is enough to get other protographs 10 with a threshold better than that of P 17. This step may be done by hand. However, step 140 may also be automated, i.e., do an edge 15 action, keep it if it results in a lower threshold and discard it otherwise. Edge 15 action means add, remove edges 15 or swap edge 15 points. In an automated process, the edge 15 of interest as well as the edge 15 actions will be chosen at random.

Let N', C', $N_t'$ be the number of variable nodes 20, check nodes 25 and punctured variable nodes 20 in the protograph P 17. Then one can verify that the rate of the resulting protograph, P 17, is 1/n;

$$\frac{N' - C'}{N' - N_t'} = \frac{(m-1)(N-C) - (N-C)(m-2)}{(m-1)(N-N_t) - (N-C)(m-2)} = \frac{1}{m} \qquad \text{Eq. 1}$$

It is noted that since protograph P 17 is obtained from B_(m−1) 14 by pruning nodes 20 and edges 15, then P 17 is a subgraph of B_(m−1) 14. This implies that the girth of P 17 is at least as large as the girth of B_(m−1) 14. Then maximizing the girth of B_(m−1) 14 is equivalent to a constrained maximization of the girth of P 17. Further more, if G is the lifted graph 18 constructed from P 17, G 18 is loop free if P 17 is loop free. Also, it is possible to construct G 18 with a larger girth if the girth of P 17 is larger. This is a favorable property in G 18 as a larger girth often corresponds to a low error floor in the high signal-to-noise (SNR) region.

The new code of rate 1/m is constructed from the protograph B_(m−1) by a copy and permute approach where the number of copies is calculated according to the desired payload size k of the code.

Generating Rate Compatible Codes for Hybrid ARQ Applications Using Puncturing

The present patent application is directed to generating families of rate compatible (RC) LDPC codes suitable for hybrid ARQ applications with high throughput. Rate-compatible codes are a family of nested codes with different rates where the codeword bits from the higher-rate codes are embedded in the lower-rate codes, and, hence, can be encoded using a single encoder/decoder pair. In other words, all the bits of a codeword of a code with a given rate appear in one of the codewords of any lower-rate code. They are of particular interest in packet data systems that allow for retransmission request such as automatic repeat request with forward error correction (ARQ/FEC) systems to achieve desired throughput efficiency with a high degree of flexibility.

The following is a general description of how rate-compatible coding works. i) Initially, the transmitter 2608 sends a codeword from a high rate code through the noisy channel (i.e., the transmitter 2608 tries to minimize the number of bits sent through the channel. ii) Given the received corrupted codeword, the receiver 2610 tries to perform decoding (error correction and error detection). If the receiver 2610 has problems correcting errors and recovering the original message, it sends a feedback message informing the transmitter 2608 that the codeword does not have enough redundancy to protect the information from errors, and requests additional bits to help recover the information. Thus, according to this feedback information, the encoder 552 decides to either transmit extra bits of redundancy or proceed to the next information block. iii) Once the transmitter 2608 receives the request from the receiver 2610, it constructs a codeword with lower rate, and transmits only additional bits corresponding to the extra redundancy. Notice that due to the nested nature of RC codes all the bits from the higher rate code that have already been sent do not need to be retransmitted, which makes RC codes very efficient.

In one embodiment, these low rate codes are used as parent codes of rate compatible families. The present method and apparatus comprises puncturing low-rate codes in a rate compatible manner to construct codes of higher rates are shown. That is, the present method and apparatus comprises a novel and nonobvious search method of rate-compatible puncturing patterns to find good high-rate codes from low-rate mother codes. When puncturing is used to construct rate-compatible codes, e.g., change the rate of a code to a higher rate, an encoder punctures (deletes) a subset of the codeword bits. In the disclosed apparatus, the encoder 552 generates a full set of parity bits, but some are not transmitted, i.e., they are punctured. The decoder 537 inserts erasures to where parities are punctured and performs the decoding method as in a non-punctured case.

In the prior art, methods for obtaining higher rate codes from lower rate structured LDPC codes relied on interconnecting systematic input data nodes 20 to the graph 10 to obtain a higher rate code. Another approach (proposed for irregular LDPC ensembles) is to null information symbols from a higher rate code to obtain a lower rate code. From the previous discussion, we see that these approaches may not be rate compatible for hybrid ARQ applications since all codes in a hybrid ARQ rate compatible family may have the same information block size across the different rates.

The AWGN threshold is the lowest signal to noise ratio (SNR) at which the error probability can go to zero under Belief Propagation decoding as the block length and the number of iterations tend to infinity when the channel is an AWGN channel.

One embodiment of the present method of generating a rate compatible family of codes is to design robust low rate codes by the methods discussed earlier. These codes will serve as the parent code for the rate compatible family. Higher rate codes in the family may be obtained by carefully puncturing redundancy symbols. Lower rate codes in the family may be obtained by extending the code through adding redundancy nodes.

The present patent application discloses different embodiments for puncturing patterns. While the idea of puncturing an LDPC code is not totally new, puncturing structured LDPC codes in a rate compatible manner is one advantage of the present patent application over the prior art. Also, puncturing LDPC code from irregular ensembles disclosed in the prior art may not directly apply for structured LDPC codes. This is due to the fact that they may not take into account the existence of other punctured nodes in the graph 10.

Furthermore, the puncturing pattern for irregular ensembles with a given degree distribution is determined by optimizing the fraction of each set of variable nodes 20 in the graph 10, with a certain degree, to be punctured. On the other hand, in many cases of structured LDPC codes, the non-systematic non-punctured variable nodes 20 are of the same degree. Furthermore, the puncturing methods developed in this patent application apply to any LDPC codes and not only structured LDPC codes.

Puncturing on the Protograph Level

Typically when puncturing an LDPC code, take an LDPC code of rate $R_p=k/n$, where k and n are the length of the information blocks and the codewords, respectively. To generate a code with a new rate, puncture a subset of bits 30 in the codeword and send the unpunctured bits to the receiver 2610. It is assumed that the decoder 557 knows the position of punctured bits 30 in the codeword.

A straight-forward way to puncture structured LDPC codes is to puncture the desired variable nodes 20 at the protograph 10 level. This will have the advantage that the puncturing pattern will be regular on the lifted graph 10 and the same across different block sizes. Unfortunately, due to the small size of the protographs 10 only a limited number of rates may be achievable by puncturing on the protograph 10 level. Moreover, it may be shown by analyzing an accumulate-repeat-check-accumulate (ARCA) protograph 10, that puncturing on the protograph 10 level may not result in good codes.

Figure 11:
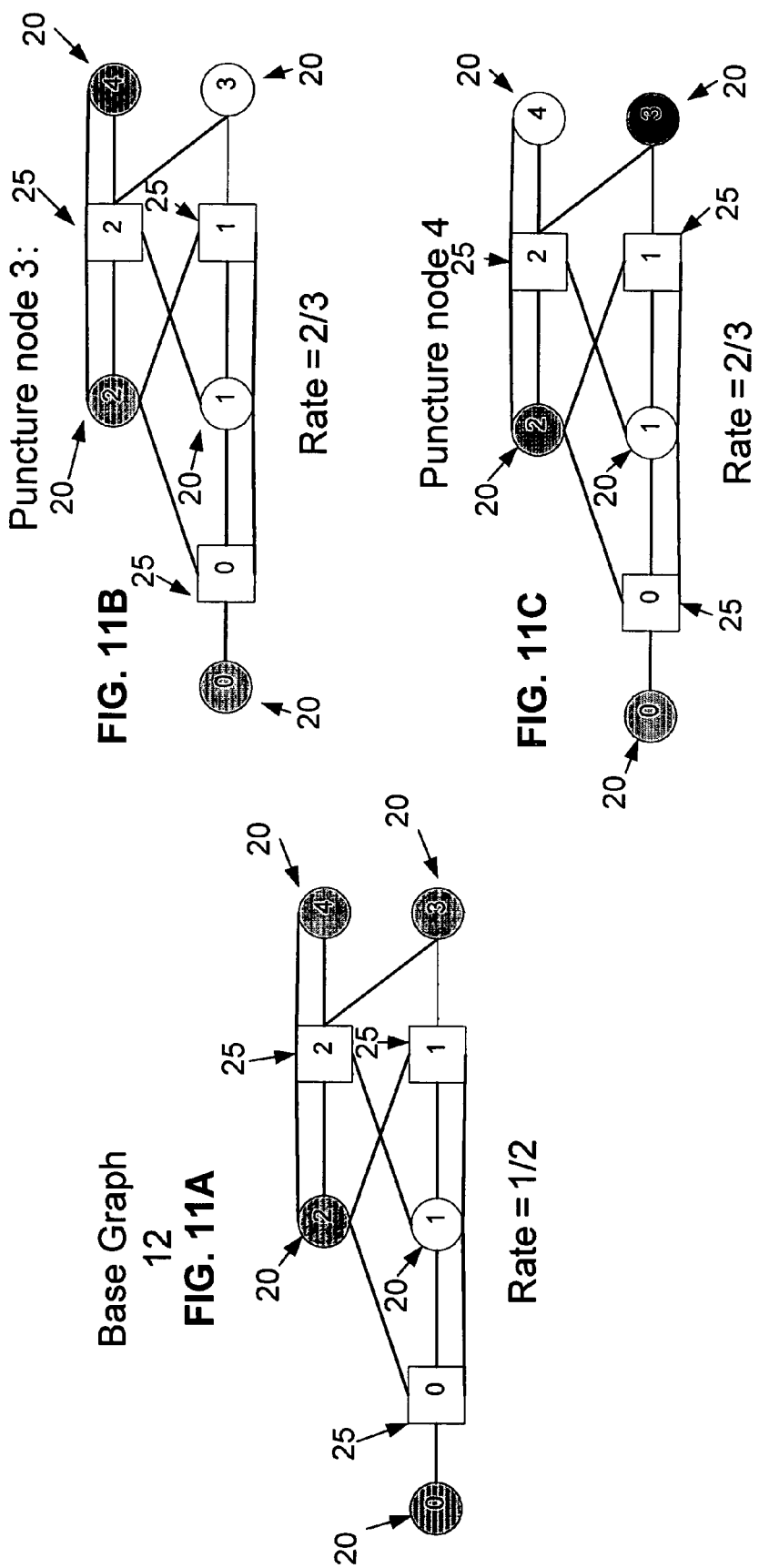
FIG. 11A represents a protograph base ½ ARCA code.
FIG. 11B shows a protograph with variable node 3 punctured yielding a ⅔ rate.
FIG. 11C shows a protograph with variable node 4 punctured yielding a ⅔ rate.

FIGS. 11A-C represent protographs 10 for a simple rate-½ ARCA code. In FIG. 11A, since the protograph 10 has only two non-punctured non-systematic variable nodes ($V_3$ & $V_4$) 20, the achievable rates by puncturing on the protograph 10 level are either ⅔ or 1. A protograph for the base ½ ARCA code is shown in FIG. 11A. In FIG. 11A, check node 25 $C_0$, represented by a square box with a zero inside it, is connected with a double edge to a punctured variable node $V_1$ 20 represented by a circle with a 1 inside it. This is equivalent to being connected to two punctured variable nodes 20 in the lifted graph. This is also the case for check node 25 $C_1$. However, check node 25 $C_2$ is connected to only one punctured variable node 20 $V_1$. Observing the belief propagation (BP) equations (which are used to decode LDPC codes) and recalling that the reliability of a punctured variable node 20 is initially zero, it is seen that the messages sent from a check node 25 that is connected to more than one punctured variable node 20 may always be zero.

However, if a check node 25 is connected to only one punctured variable node 20 V, the reliability of this punctured variable node 20 is improved by the messages from the other variable nodes 20 connected to this same check node 25. As a result, initially check nodes 25 $C_0$ and $C_1$ will send no information until the reliability of variable node 20 $V_1$ improves by the information send to it from check node 25 $C_2$. Thus iterative message passing starts and BP works.

However, it is seen that puncturing either variable node 20 $V_3$ or $V_4$, represented by a circle with a three or four inside it respectively, to get a rate of ⅔ will result in check node 25 $C_2$ being connected to two punctured variable nodes 20 $V_1$ and $V_3$ in FIG. 11B or three variable nodes $V_1$ and two $V_4$s in FIG. 11C. FIG. 11B shows variable node 20 $V_3$ punctured, while FIG. 11C shows variable node 20 $V_4$ punctured. Thus, all the check nodes 25 in the graph are connected to more than one punctured node and the information transmitted from the check nodes to the variable nodes 20 is always zero and iterative message passing may not start. Thus, regular puncturing by puncturing on the protograph 10 level may not be preferred.

Regular-Irregular Puncturing Method

Instead of executing regular puncturing on the protograph 10, one can regularly puncture the redundancy variable nodes 20 in the lifted graph 10. This is gives the flexibility of choosing any family of required rates. The puncturing pattern will be as regular as possible with respect to the preceding codes in the family. For the higher rates, it becomes more irregular and random with respect to the parent code. Let $C\{R_m\}$ denote the code in the rate compatible family with rate $R_m$. The regular-irregular puncturing method 200 executes the following steps illustrated in the flowchart of FIG. 12.

Step 210—Choose a parent code $C\{R_0\}$ with the desired base rate $R_0$, where $C\{R_0\}$ denote the code with rate $R_0$.

Step 220—For each rate $R_m$ in the set of desired rates, $R_1, R_2, \ldots R_p$, $(R_p > \ldots > R_2 > R_1)$, find the set of non-punctured redundancy variable nodes 20 $V_r$ in a preceding code $C\{R_{m-1}\}$, where $C\{R_{m-1}\}$ denotes the preceding code with code rate $R_{m-1}$. $R_{m-1}$ is the rate of the preceding code which is to be punctured to yield a code of the desired rate $R_m$.

Step 230—Let the cardinality 50 of the set of non-punctured redundancy variable nodes 20 $V_r$ in $C\{R_{m-1}\}$ be $r_{m-1}$ (Cardinality $r_{m-1}$ 50 refers to the number of members in the set of non-punctured redundancy variable nodes 20 $V_r$ in $C\{R_{m-1}\}$, where $C\{R_{m-1}\}$ denotes the preceding code and $R_{m-1}$ is the rate of the preceding code which is to be punctured to yield a code of the desired rate $R_m$.)

Step 240—Calculate the number $p_m$, where $p_m$ is the number of variable nodes 20 to be punctured to go from a preceding rate $R_{m-1}$ to a desired rate $R_m$ by:

$$p_m = \text{Floor}(N-(N-C)/R_m - N\_t_{m-1}) \quad \text{Eq. 2,}$$

where $R_m$ is the desired rate, N and C are the number of variable nodes 20 and check nodes 25 in the lifted graph respectively, $N\_t_{m-1}$ is the total number of punctured variable nodes 20 in the lifted graph 10 corresponding to the code $C\{R_{m-1}\}$ and Floor ( ) represents the floor function which is a function that returns the largest integer less than or equal to the number inside the brackets.

Step 250—Calculate alpha 52 and beta 54 such that puncturing pattern on the non-punctured set is regular.

$$\text{Step 253—alpha} = \text{Floor}[(r_{m-1}-p_m)/(p_m-1)] \quad \text{Eq. 3}$$

$$\text{Step 256—beta} = r_{m-1} - \text{alpha}(p_m-1) - p_m \quad \text{Eq. 4}$$

Step 260—Puncture a pattern which is a function alpha 52 and beta 54 on the non-punctured set of cardinality 50 $r_{m-1}$. The following is an example of such a pattern to be punctured on the non-punctured set:

$$[N_1\{\text{alpha nodes}\}N_2\{\text{alpha nodes}\} \ldots N_m\{\text{beta nodes}\}] \quad \text{Eq. 5,}$$

$N_1, N_2, \ldots N_{p\_m}$ are the indices of the punctured variable nodes 20 within the set of non-punctured redundancy nodes 20 of cardinality $r_{m-1}$. That is, we puncture a node 20, leave alpha nodes 20 non-punctured. We repeat this till we puncture the $p_m$th variable node 20. This leaves beta nodes 20 non-punctured at the end of the set.

Figure 13:
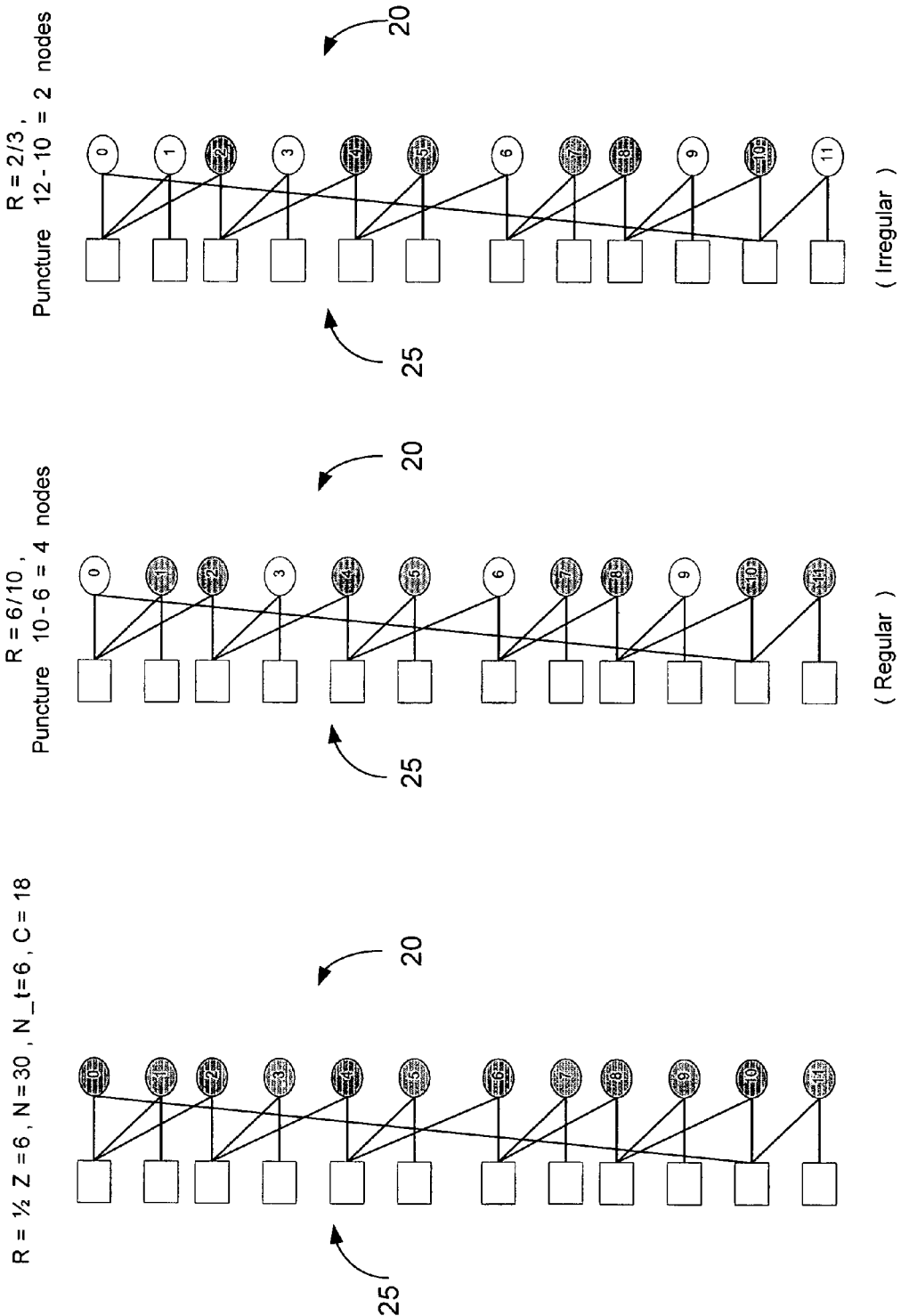
FIG. 13A shows a graph with a nonpunctured ARCA code of rate ½.
FIG. 13B shows a graph having a puncturing pattern for rate 0.6 code.
FIG. 13C shows a graph having a puncturing pattern for ⅔ rate.

The regular-irregular puncturing method is demonstrated on graphs 13A-13C. FIG. 13A shows the nonpunctured redundancy nodes 20 in a constructed Accumulate Repeat Check Accumulate (ARCA) code of rate ½. FIG. 13B shows the puncturing pattern for the rate 0.6 code.

The puncturing pattern for the rate ⅔ code shown in FIG. 13C is regular with respect to the non-punctured nodes 20 in the rate 0.6 code but is irregular with respect to that of the rate 0.5 code. For this reason, there are some check nodes 25 with no more than one punctured variable node 20 connected to them when iterative decoding starts.

Random Puncturing Method

As shown in the previous embodiment, regular and irregular puncturing patterns may not always result in an ideal family of codes. Since punctured nodes 20 are treated as erasures from the point of view of the decoding algorithm, it is preferable that the parent code have a good performance on the AWGN channel, as well as on the erasure channel. A random puncturing on the non-punctured redundancy variable nodes 20 will appear as random noise on the erasure channel and the punctured variable nodes 20 will be recovered if the code has a good performance on the erasure channel. However, in the prior art it was seen that following the analysis of the erasure channel showed that there exists a cutoff rate Rc, which depends on the degree distributions of the code and the rate of the parent code, such that one may not find a code with rate R>Rc, through puncturing the parent code, that performs well under density evolution.

Figure 14:
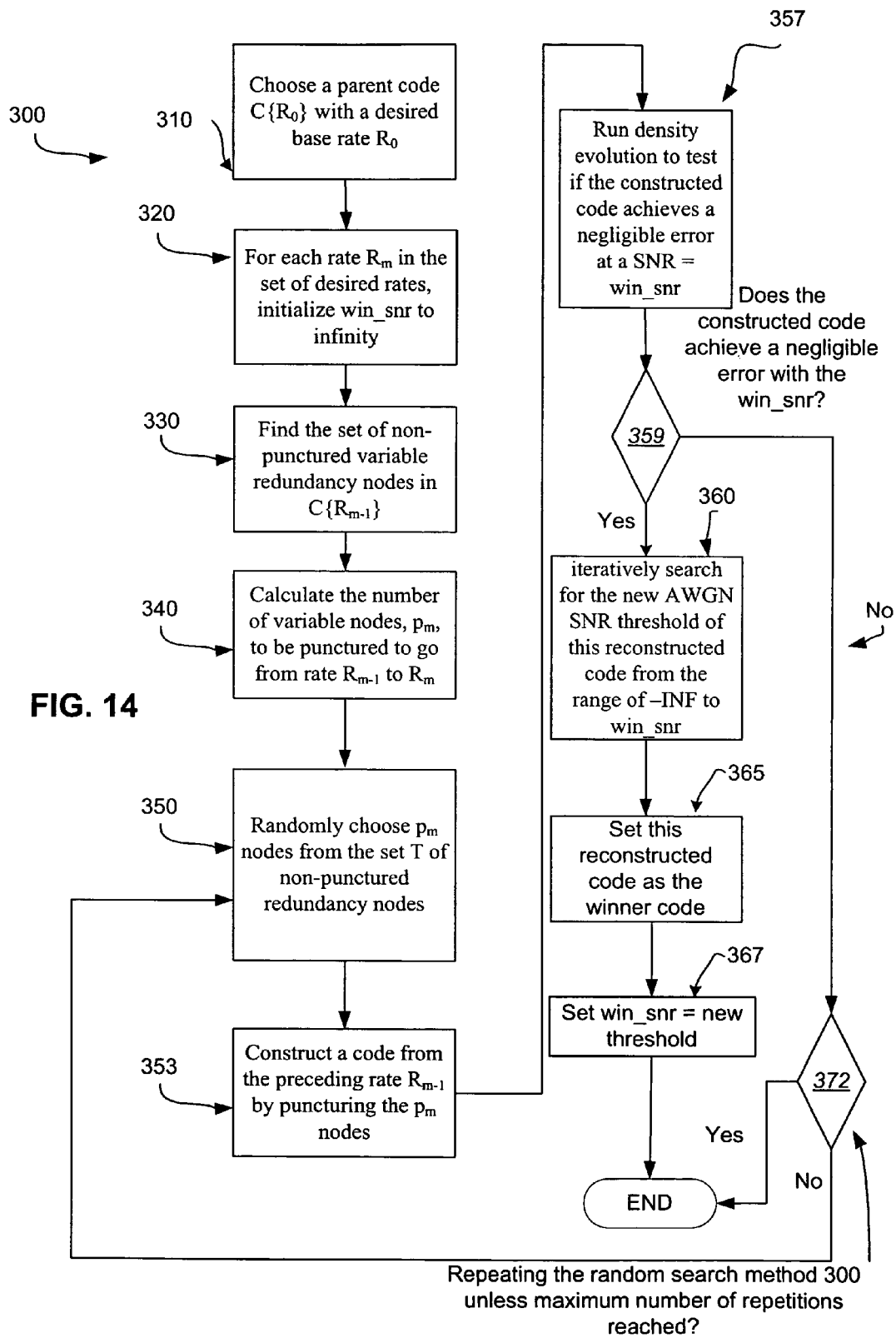
FIG. 14 is a flowchart illustrating the steps executed in the Random Search method of the present patent application.

To overcome the deficiencies of the prior art, the present patent application discloses an embodiment comprising a method for constructing a rate compatible family by searching for the best random puncturing pattern on the lifted graph 10 in a fast way. The method is called a Random Search method 300 and comprises the following steps. These steps are illustrated in the flowchart of FIG. 14.

Step 310—Start with a 'good' code with the desired base rate $R_0$, $C\{R_0\}$, i.e., choose a parent code $C\{R_0\}$ with a desired base rate $R_0$, where $C\{R_0\}$ denote the code with rate $R_0$.

Define win_snr to be the threshold SNR (for AWGN channel) of the (winner) code output from the Random Search method.

Step 320—For each $R_m$ in the set of desired rates, $R_1, R_2, \ldots R_p$, $(R_p > \ldots > R_2 > R_1)$, initialize an initial value of SNR, win_snr, to infinity, where $R_1, R_2, \ldots R_P$ represent the set of rates in the rate compatible family:

$$\text{win\_snr} = \text{INF (infinity)} \quad \text{Eq. 6}$$

Step 330—Find the set of non-punctured variable redundancy nodes 20 $V_r$, T, in $C\{R_{m-1}\}$, where $C\{R_{m-1}\}$ denotes the code with rate $R_{m-1}$. $R_{m-1}$ denotes that this is the preceding rate which is being punctured to create the new desired rate $R_m$.

Step 340—Calculate the number of variable nodes 20 to be punctured, $p_m$, to go from rate $R_{m-1}$ to $R_m$ (as in the irregular method discussed earlier).

Step 350—Randomly choose $p_m$ variable nodes 20 V from the set T of non-punctured redundancy variable nodes 20, where $p_m$ represents the number of variable nodes 20 to be punctured.

Step 353—Construct a code from the preceding rate $R_{m-1}$ by puncturing the $p_m$ variable nodes 20.

Step 357—Run density evolution to test if the constructed code achieves a negligible error at a signal to noise ratio (SNR) equal to win_snr.

Step 359—Does the constructed code achieve a negligible error with the win_snr?

If yes, then

Step 360—iteratively search for the new AWGN SNR threshold (see [0091]) of this reconstructed code over the SNR range of −INF to the initialized value of SNR, win_snr. In one embodiment, this is done by iteratively bisecting the SNR range to select a test SNR and see if the test SNR achieves a zero error probability under Density Evolution. The process is repeated till a desired accuracy in the SNR is achieved. The win_snr is reset to be the threshold of this code that achieves zero error. (One can observe that the new value of win_snr is smaller than the older value.)

Step 365—Set this reconstructed code as the winner code.

$$\text{Step 367—Set win\_snr=new threshold} \qquad \text{Eq. 7}$$

Step 370—If the code does not achieve a negligible error with the win_snr, i.e., No to step 359, then skip to step 372.

Step 372—Repeat the random search method until a maximum number of repetitions by returning to step 350. The maximum number of repetitions is determined by computing resources available. In one implementation, it is 5.

As seen from the disclosure above, the random search method is a greedy method in that it searches for the best code at each design rate R_m after finding the best code at the design rate R_{m−1}.

Progressive Node Puncturing Method 400

Another embodiment uses progressive node puncturing 400. With progressive node puncturing 400, for a certain design rate, progressively choose the puncturing pattern that:

Condition A—maximizes the number of check nodes 25 C in the graph 10 which are connected to only one punctured variable node 20 while Condition B—minimizing the average number of punctured variable nodes 20 connected to each check node 25, and Condition C—maximizing the connectivity between the check nodes 25, connected to only one punctured variable node 20, and the other punctured variable nodes 20.

The present method and apparatus punctures the variable node 20 from the set of the non-punctured variable nodes 20, which is connected to the least number of check nodes 25 which are in turn connected to only one punctured variable node 20. If more than one such variable node 20 exists, then puncture the variable node 20 from the set which has the minimum number of punctured variable nodes 20 connected to its neighboring check nodes 25. If more than one such variable node 20 exists, we choose one variable node 20 at random. This whole process can be repeated, to get another code of the same desired rate but with another puncturing pattern. Then choose the code with the highest puncturing score.

The puncturing score of a Tanner graph with punctured nodes 20 is a measure of how well the check nodes 25 with one punctured variable node 20 are connected to the other check nodes 25 which are in turn connected to punctured variable nodes 20.

One advantage of progressive node puncturing is that it assigns the puncturing pattern for a certain rate such that further puncturing of this code would result in good higher rate codes. The designed codes will have good AWGN and erasure thresholds over the whole family range as well as good error floors. This is especially true for the higher rate codes in the family.

The reasoning behind condition A is that a check node 25 (of degree greater than 1) with only one punctured variable node 20 connected to it will transmit non-zero information to the single punctured variable node 20 and the single punctured variable node 20 may recover from an error. Maximizing the number of check nodes 25 with only one punctured variable node 20 connected could result in some other check nodes 25 having a large number of punctured nodes 20 connected to them 25. A check node 25 with more than one punctured variable node 20 connected will transmit zero information to all the punctured variable nodes 20 unless all but one of these punctured variable nodes 20 are recovered by a message passing from other check nodes 25. Thus it is desirable to minimize the maximum number of punctured variable nodes 20 connected to any check node 25, which implies condition B. This also implies that it is desirable that check nodes 25 with no punctured variable nodes 20 or only one punctured variable node 20 connected to them 25 have a high connectivity to the other check nodes 25 with more than one punctured variable node 20, which is condition C.

The following are the steps executed when using the progressive node puncturing method 400. These steps are illustrated in the flowchart of FIG. 15.

Step 410—For each desired rate $R_m$ in the set of desired rates, obtain $C\{R_m\}$ from $C\{R_{m-1}\}$ by progressively puncturing $p_m$ variable nodes 20 from the set T of the non-punctured redundancy variable nodes 20 of cardinality 50 $r_{m-1}$; where n is the length of the codeword and $p_{m-1}$ is the total number of punctured variable nodes 20 in the preceding graph 10. Also, $C\{R_m\}$ denotes the code with rate $R_m$, $C\{R_{m-1}\}$ denotes the code with rate $R_{m-1}$ and $R_{m-1}$ denotes that this is the preceding rate which is being punctured to create the new desired rate $R_m$.

Step 420—Initialization

Step 422—For each check node 25 (connected to redundancy variable nodes 20), calculate F(C)=number of punctured redundancy variable nodes 20 connected to check node 25. (F(C)=1 means that a check node 25 is connected to only one punctured variable node 20).

Step 424—Find the set R of non-punctured redundancy variable nodes 20.

Step 426—For each non-punctured redundancy variable node 20, calculate $G(V_r)$=number of neighboring check nodes 25 to non-punctured redundancy variable nodes 20 with F(C)=1, i.e., the number of check nodes 25 connected to the non-punctured redundancy variable nodes 20, wherein the check node 25 is connected to only one punctured redundancy variable node 20, and Step 428—For each non-punctured redundancy variable node 20, calculate $$H(V_r)=\text{Sum}[F(C)|C \text{ is a neighbor to } V_r] \qquad \text{eq. 8.}$$

That is, $H(V_r)$ is the sum of the number of punctured redundancy variable nodes 20 connected to check node 25, where check node 25 is connected to a non-punctured redundancy variable nodes 20.

Step 430—Puncturing by finding the punctured variable node 20 while p<$p_m$ (i.e., the number of punctured variable nodes 20 p at this step<the number of punctured variable nodes 20 for the desired rate, $p_m$), comprising the following steps:

$$\text{Step 432—Find } T=\{V_r \text{ in } R|G(V_r)=\min[G(V_r)]\} \qquad \text{eq. 9,}$$

i.e., find a set of non-punctured variable nodes 20 T in the set of non-punctured variable nodes 20 R for which the number of neighboring check nodes 25 connected to only one non-punctured variable node 20 is a minimum.

$$\text{Step 434—If } |T|=1; V_p=T \qquad \text{eq. 10,}$$

i.e. if only one non-punctured redundant variable node 20 has the minimum value of $G(V_r)$ and the size of the set T found in step 4a is 1, then set the variable node 20 to be punctured at this step to be the single variable node 20 found in the set T.

$$\text{Step 435—If } |T|>1, \text{ execute steps 436-439} \qquad \text{eq. 11,}$$

i.e., if there is more than one variable node 20 in the set T found in step 432, execute steps 436-439:

$$\text{Step 436—Find } U=\{V_r \text{ in } T|H(V_r)=\min[H(V_r)|V_r \text{ in } T]\} \qquad \text{eq. 12,}$$

i.e., find the subset U of the non-punctured variable nodes 20 in the set T, found in step 432, in which the sum of the number of punctured variable nodes 20 connected to check nodes 25 which are connected to the non-punctured variable nodes 20 is a minimum.

Step 437—If |U|=1, then $V_p=U$, eq. 13 i.e., if the size of the subset U found in step 436 is 1, then set the punctured variable node 20 to be the single variable node 20 in the set U.

Step 438—If |U|>1, choose $V_p$ from U at random, eq. 14 i.e., if the size of the set U found in step 436 is greater than 1, then choose the variable nodes 20 to be punctured from the non-punctured variable nodes 20 in the subset U from step 436 at random.

Step 439—Puncture the chosen variable node 20 and remove the punctured, chosen variable node 20 from the set of non-punctured variable nodes 20 R.

Step 440—Update the functions by executing steps 442 and 444.

Step 442—For each check node 25 neighboring punctured variable node 20 update F(C), where F(C) equals a number of punctured redundancy variable nodes 20 connected to the check node 25.

Step 444—For each variable node 20 neighboring check node 25, update $G(V_r)$ and $H(V_r)$, where $G(V_r)$=the number of check nodes 25 connected to non-punctured redundancy variable nodes 20, wherein the check node 25 C is connected to only one punctured redundancy variable node 20 and $H(V_r)$=the sum of punctured redundancy variable nodes 20 connected to check node 25, where check node 25 is connected to non-punctured redundancy variable nodes 20.

Step 446—$p=p+1$} eq. 15 i.e., go to the next iteration. Find the next node to be punctured. The iteration stops when $p=p_m$, i.e., when all the nodes to be punctured at this rate have been punctured.

The steps in the progressive node puncturing method implement conditions A and B where the variable node 20 is punctured with the least number of check nodes 25 connected to it, wherein the check nodes 25 are connected to one punctured variable node 20. This is due to the fact that puncturing this variable node 20 will result in these check nodes 25 having being connected to two punctured variable 20 nodes instead. If more than one such variable node 20 exists, then choose the variable node 20 with the least number of punctured variable nodes 20 in the second level of the support tree expanded from this variable node 20. This is an efficient way of implementing condition B. In most embodiments, there is still more than one candidate variable node 20 for puncturing to choose from, i.e., |U|=1. In the stated progressive node puncturing method, a variable node 20 to be punctured is chosen at random from this set.

Next, define the puncturing score of a check node 25, S(C), to be the sum of the punctured variable nodes 20 connected to the check nodes 25 reached by a two level expansion of the support tree of check node 25 and is calculated as follows, S(C)=Sum[F(C')|check node 25 C' is a neighbor of variable node 20 V and variable node 20 V is a neighbor of check node 25 C].

The puncturing score of the graph 10 g, $S_g$, is the sum of the puncturing scores of all check nodes 25 that have only one of their neighboring variable nodes 20 punctured, $Sg$=Sum[$S(C)$|C in g&F(C)=1] eq. 17.

The puncturing score is an approximate and an efficient way to measure how well the check nodes 25 with one punctured variable node 20, are connected to the other check nodes 25 with punctured variable nodes 20. Thus, the progressive node puncturing method 400 is modified by executing the following steps listed below to implement condition C:

Progressive Node Puncturing Method (Outer Loop)

Step 450—Maximizing the connectivity between the check nodes with only one punctured variable nodes 20 and the other punctured variable nodes 20 by executing steps 452-459.

Step 452—Initialize: $Sg_0=0, t=1$, eq. 18 i.e., initialize the puncturing score of the graph 10 g, $S_g$, to zero at the first iteration, t=1.

While (t<max_iterations) {

Step 454—Change the random seed.

Step 456—Run the progressive node puncturing method 400 on the code $C\{R_{m-1}\}$ to get a desired punctured code $C_t\{R_m\}$, where $C\{R_{m-1}\}$ is the code for the preceding rate.

Step 458—Calculate the puncturing score of the graph 10 associated with the desired punctured code $C_t\{R_m\}$, Sg, t.

Step 459—If $Sg_t > Sg_{t-1}$, set $C\{R_m\}$ to be $C_t\{R_m\}$ eq. 19

(choose the puncturing pattern with the largest puncturing score), i.e., if the puncturing score of the graph 10 associated with the desired punctured code $C_t\{R_m\}$ is greater than the puncturing score of the preceding graph 10 at iteration t−1, choose the puncturing pattern with the largest puncturing score.

Step 460—$t=t+1$ eq. 20, i.e., go to the next iteration.

Figure 16:
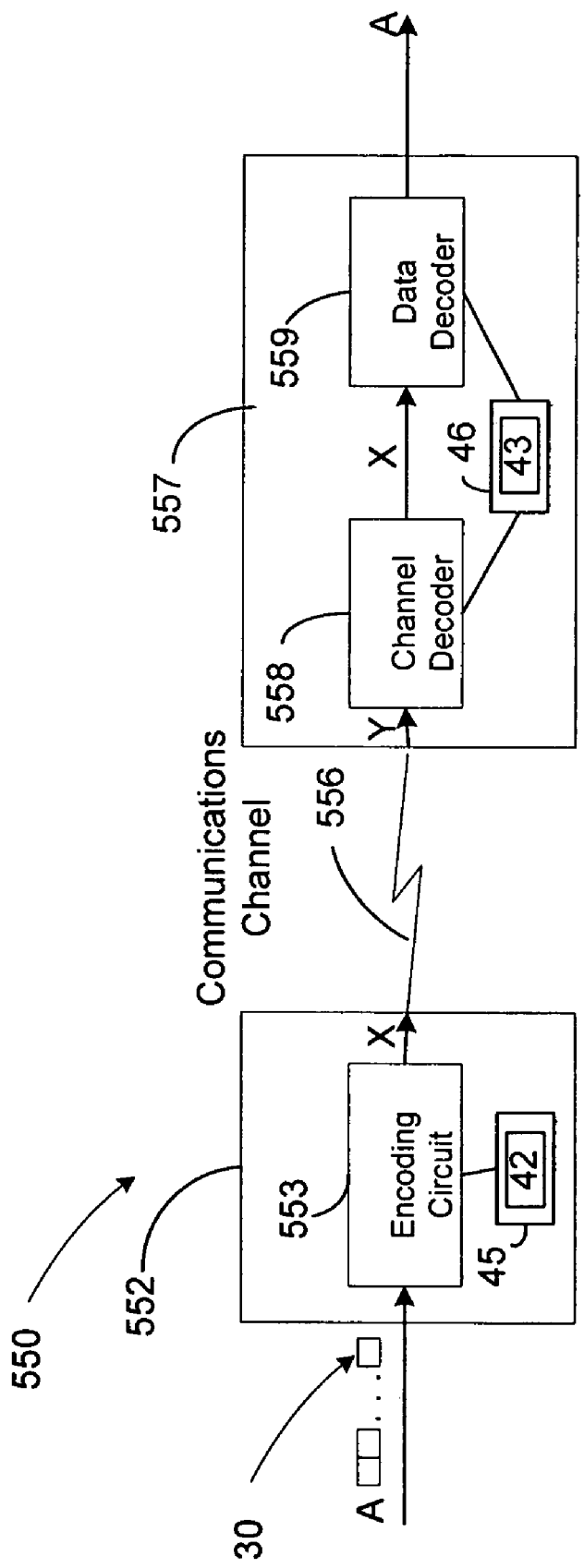
FIG. 16 is a functional block diagram of a system comprising an encoder, a decoder and a communications channel.

FIG. 16 illustrates a system 550 which includes an encoder 552, a decoder 557 and a communication channel 556. The encoder 552 includes an encoding circuit 553 that processes the input data A to produce a codeword X. The codeword X includes, for the purposes of error detection and/or correction, some redundancy. The codeword X may be transmitted over the communications channel 556. As a result of distortions produced by the communications channel 556, portions of the transmitted codeword may be lost or corrupted. From the decoder's perspective, punctured bits 30 may be interpreted as lost.

At the receiver soft bits 30 are inserted into the received word to take the place of lost or punctured bits 30. An inserted erasure indicates and/or bits 30 lost in transmission.

The decoder 557 will attempt to reconstruct the full codeword X from the received word Y and then perform a data decoding operation to produce data A from the reconstructed codeword X.

The decoder 557 includes a channel decoder 558 for reconstructing the complete codeword X from the received word Y. In addition it includes a data decoder 559 for removing the redundant information included in the codeword to produce the original input data A from the reconstructed codeword X.

It will be appreciated that received words generated in conjunction with LDPC coding, can be processed by performing LDPC decoding operations thereon, e.g., error correction and detection operations, to generate a reconstructed version of the original codeword. The reconstructed codeword can then be subject to data decoding to recover the original data that was coded. The data decoding process may be, e.g., simply selecting a specific subset of the bits 30 from the reconstructed codeword. The steps illustrated in FIGS. 5, 12, 14, 15A and 15B may be stored as instructions in the form of software or firmware 42 located in memory 45 in the encoder 552. These instructions may be executed by the encoding circuit 553. The steps illustrated in FIGS. 5, 12, 14, 15A and 15B may also be stored as instructions in the form of software or firmware 43 located in memory 46 in the decoder 557. These instructions may be executed by the channel decoder 558.

Figure 17:
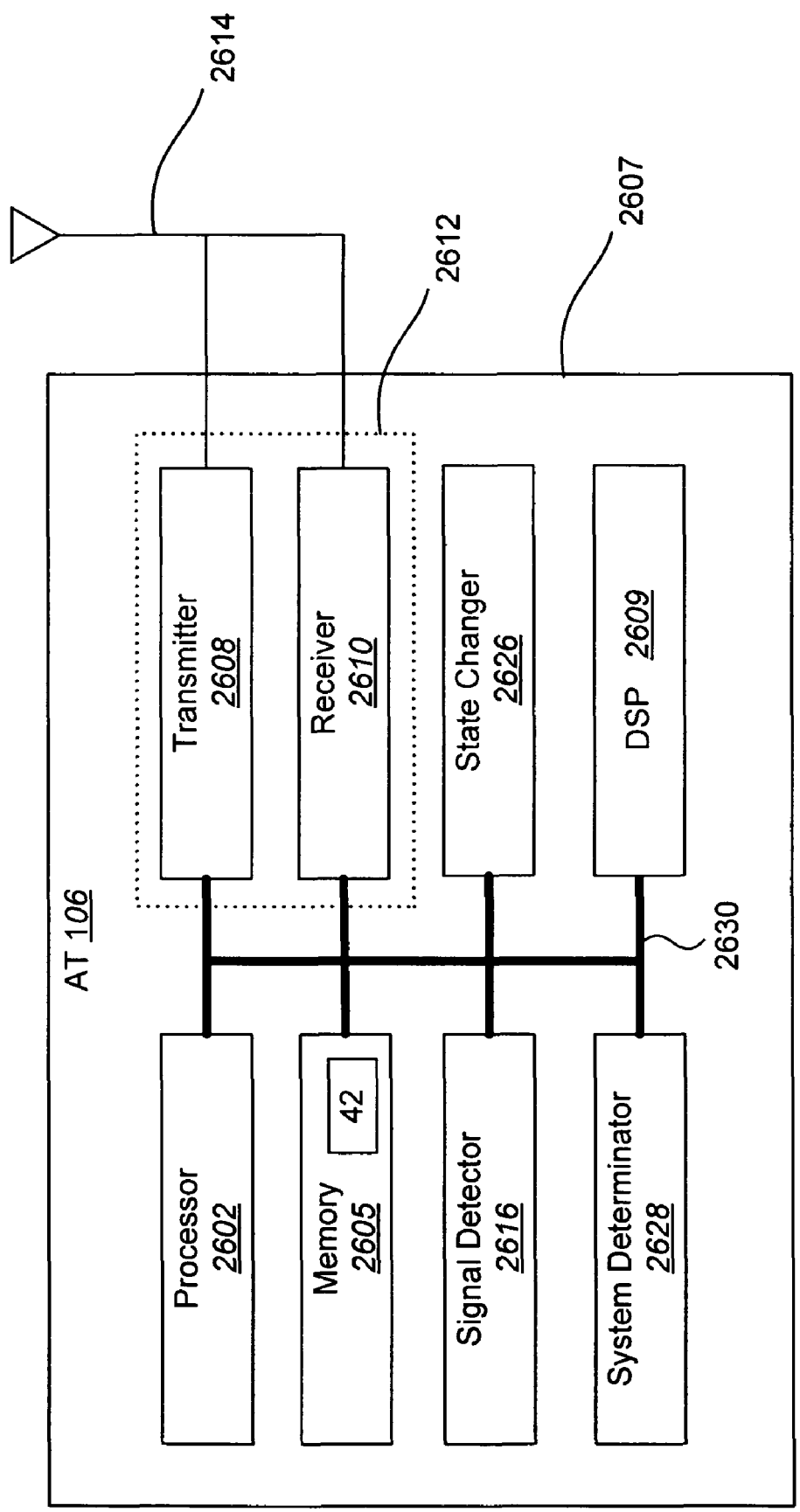

FIG. 17 is a functional block diagram illustrating an embodiment of an AT 106. The AT 106 includes a processor 2602 which controls operation of the AT 106. The processor 2602 may also be referred to as a CPU. Memory 2605, which may include both read-only memory (ROM) and random access memory (RAM), provides instructions and data to the processor 2602. A portion of the memory 2605 may also include non-volatile random access memory (NVRAM). The steps illustrated in FIGS. 5, 12, 14, 15A and 15B may be stored as instructions located as software or firmware 42 located in memory 2605. These instructions may be executed by the processor 2602.

The AT 106, which may be embodied in a wireless communication-device such as a cellular telephone, may also include a housing 2607 that contains a transmitter 2608 and a receiver 2610 to allow transmission and reception of data, such as audio communications, between the AT 2606 and a remote location, such as an AN 122. The transmitter 2608 and receiver 2610 may be combined into a transceiver 2612. An antenna 2614 is attached to the housing 2607 and electrically coupled to the transceiver 2612. Additional antennas (not shown) may also be used. The operation of the transmitter 2608, receiver 2610 and antenna 2614 is well known in the art and need not be described herein.

The AT 106 also includes a signal detector 2616 used to detect and quantify the level of signals received by the transceiver 2612. The signal detector 2616 detects such signals as total energy, pilot energy per pseudonoise (PN) chips, power spectral density, and other signals, as is known in the art.

A state changer 2626 of the AT 106 controls the state of the wireless communication device based on a current state and additional signals received by the transceiver 2612 and detected by the signal detector 2616. The wireless communication device is capable of operating in any one of a number of states.

The AT 106 also includes a system determinator 2628 used to control the wireless communication device and determine which service provider system the wireless communication device should transfer to when it determines the current service provider system is inadequate.

The various components of the AT 106 are coupled together by a bus system 2630 which may include a power bus, a control signal bus, and a status signal bus in addition to a data bus. However, for the sake of clarity, the various busses are illustrated in FIG. 7 as the bus system 2630. The AT 106 may also include a digital signal processor (DSP) 2609 for use in processing signals. One skilled in the art will appreciate that the AT 106 illustrated in FIG. 7 is a functional block diagram rather than a listing of specific components.

Figure 18A:
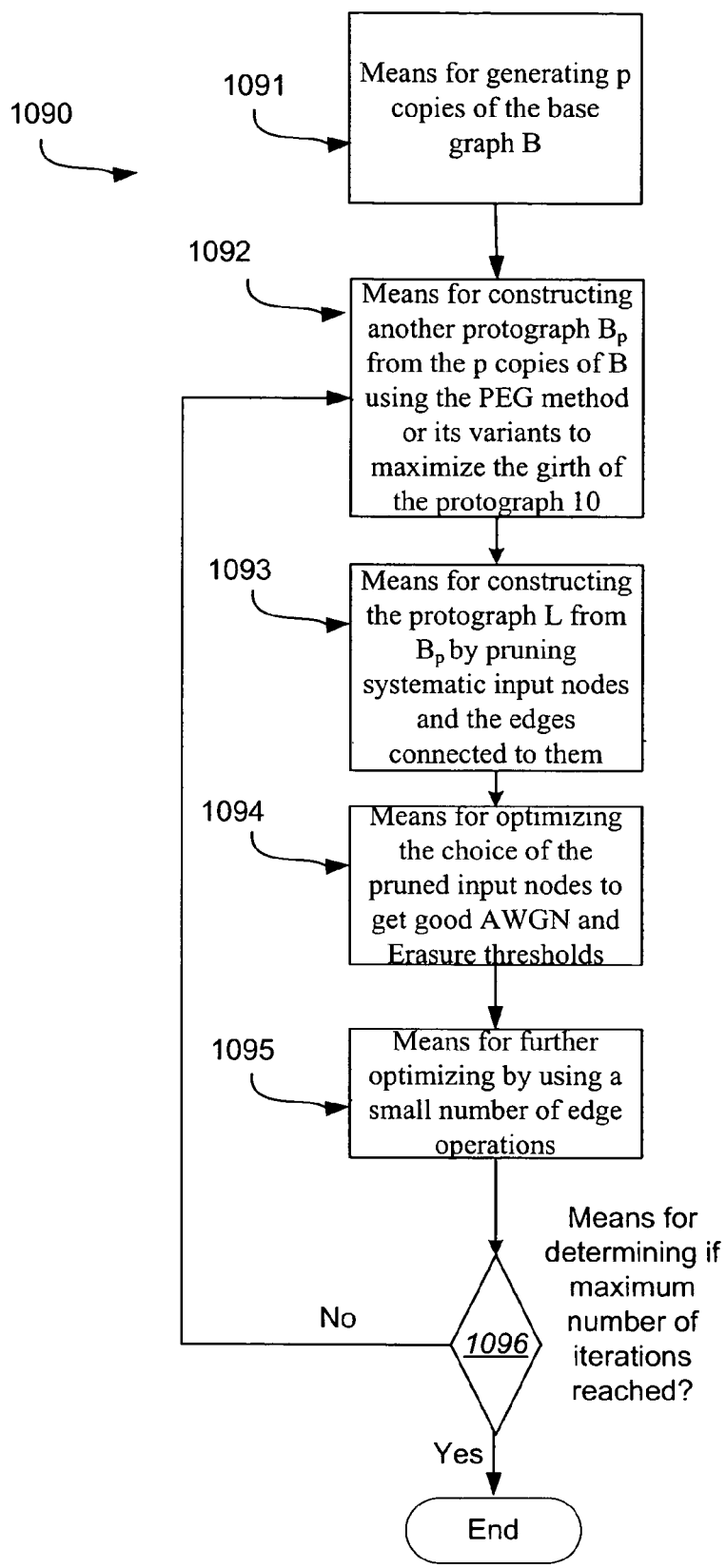
FIG. 18A is a functional block diagram illustrating the steps that are executed when generating low rate protographs from high rate protographs.

The methods and apparatuses of FIG. 5A described above are performed by corresponding means plus function blocks illustrated in FIG. 18A. In other words, steps 90, 91, 92, 93, 94, 95 and 96 in FIG. 5A correspond to means plus function blocks 1090, 1091, 1092, 1093, 1094, 1095 and 1096 in FIG. 18A.

Figure 18B:
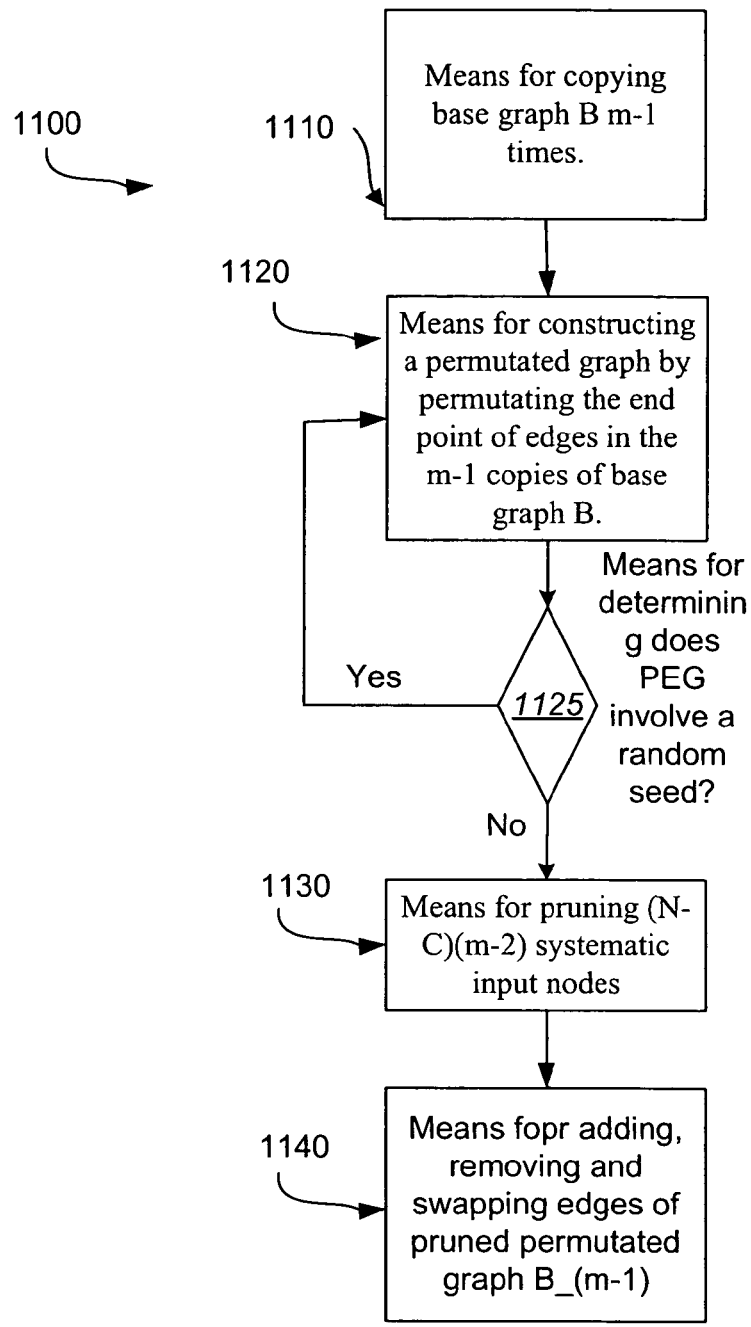
FIG. 18B is a functional block diagram illustrating the steps that are executed when generating low rate protographs from high rate protographs where the design rate is 1/m.

The methods and apparatuses of FIG. 5B described above are performed by corresponding means plus function blocks illustrated in FIG. 18B. In other words; steps 100, 110, 120, 125, 130, and 140 in FIG. 5B correspond to means plus function blocks 1100, 1110, 1120, 1125, 1130 and 1140 in FIG. 18B.

Figure 12:
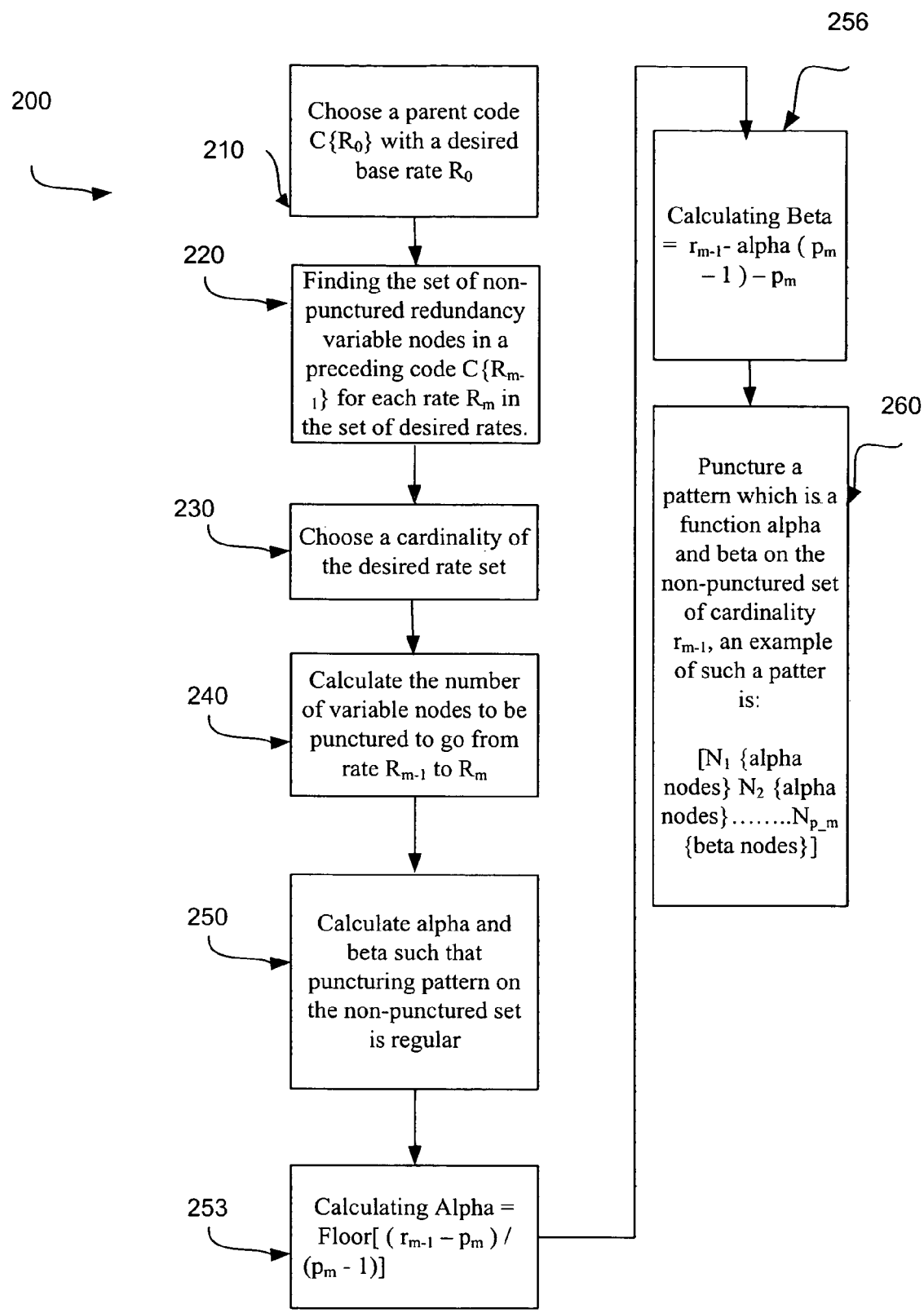
FIG. 12 is a flowchart illustrating the steps executed in the regular-irregular puncturing method of the present patent application.
Figure 19:
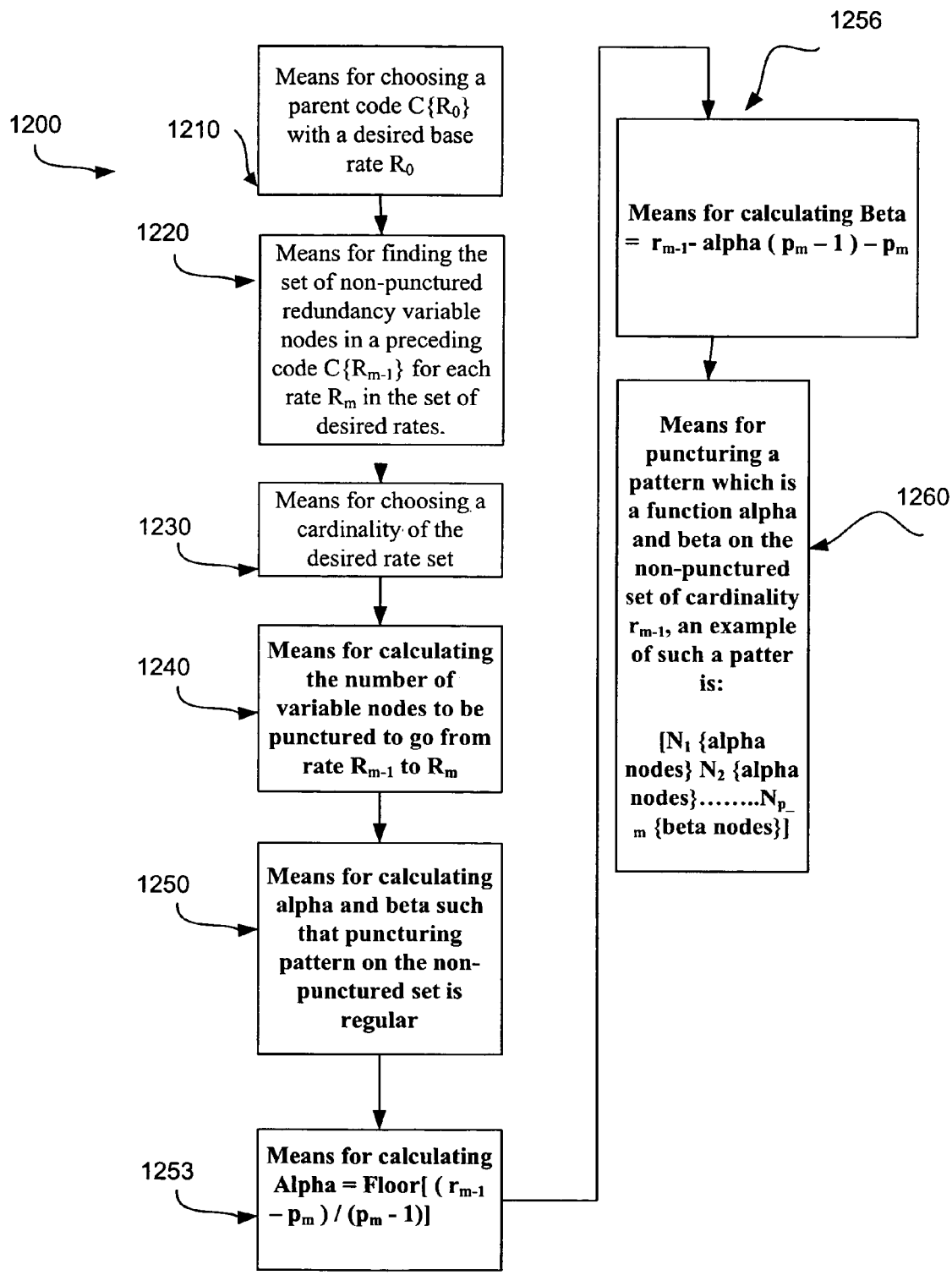
FIG. 19 is a functional block diagram illustrating the steps executed in the regular-irregular puncturing method of the present patent application.

The methods and apparatuses of FIG. 12 described above are performed by corresponding means plus function blocks illustrated in FIG. 19. In other words, steps 200, 210, 220, 240, 250, 253, 256 and 260 in FIG. 12 correspond to means plus function blocks 1200, 1210, 1220, 1240, 1250, 1253, 1256 and 1260 in FIG. 19.

Figure 20:
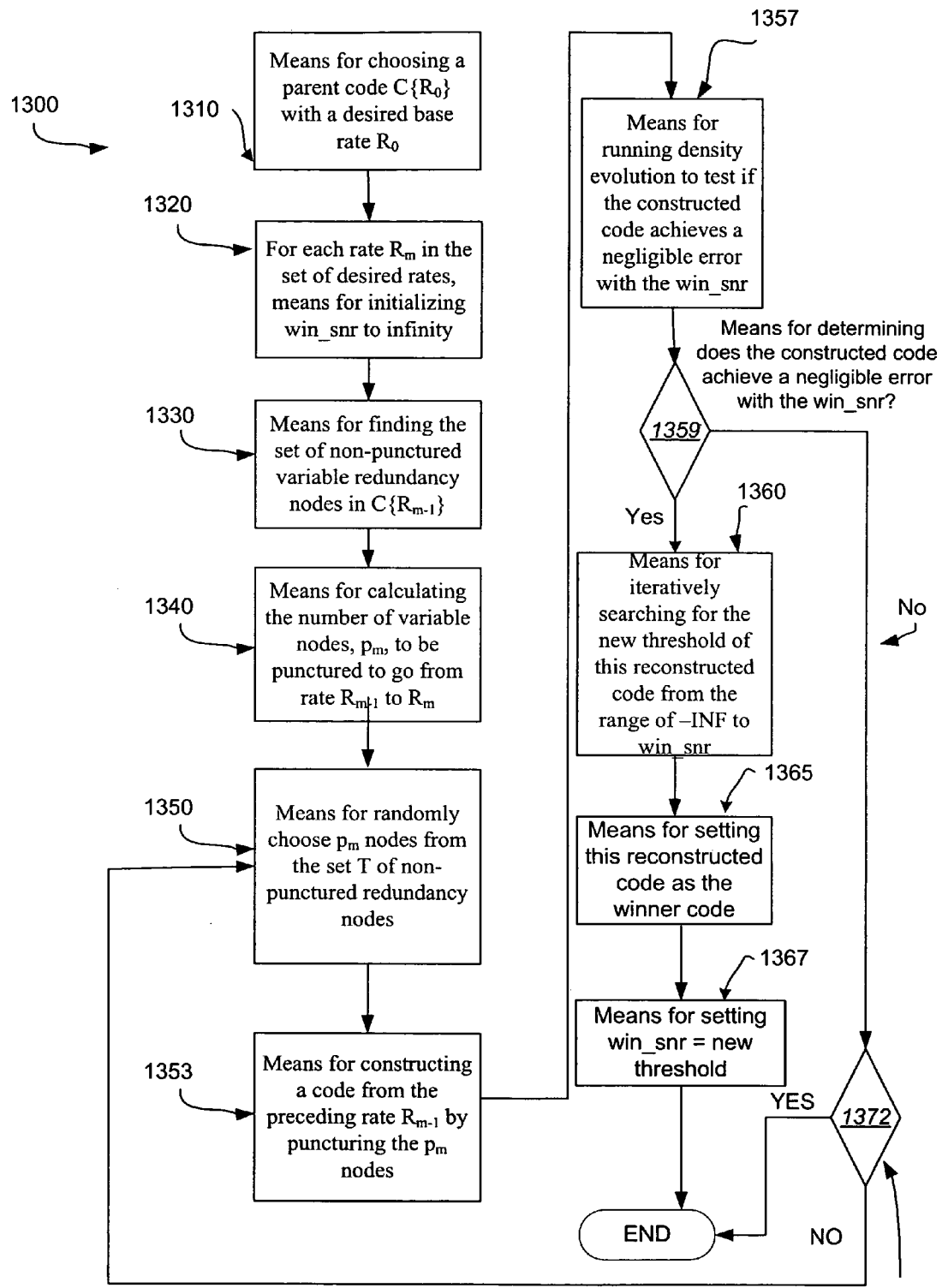
FIG. 20 is a functional block diagram illustrating the steps executed in the Random Search method of the present patent application.

The methods and apparatuses of FIG. 14 described above are performed by corresponding means plus function blocks illustrated in FIG. 20. In other words, steps 300, 310, 320, 330, 340, 350, 353, 357, 359, 360, 365, 367 and 372 in FIG. 14 correspond to means plus function blocks 1300, 1310, 1320, 1330, 1340, 1350, 1353, 1357, 1359, 1360, 1365, 1367 and 1372 in FIG. 20.

Figure 15A:
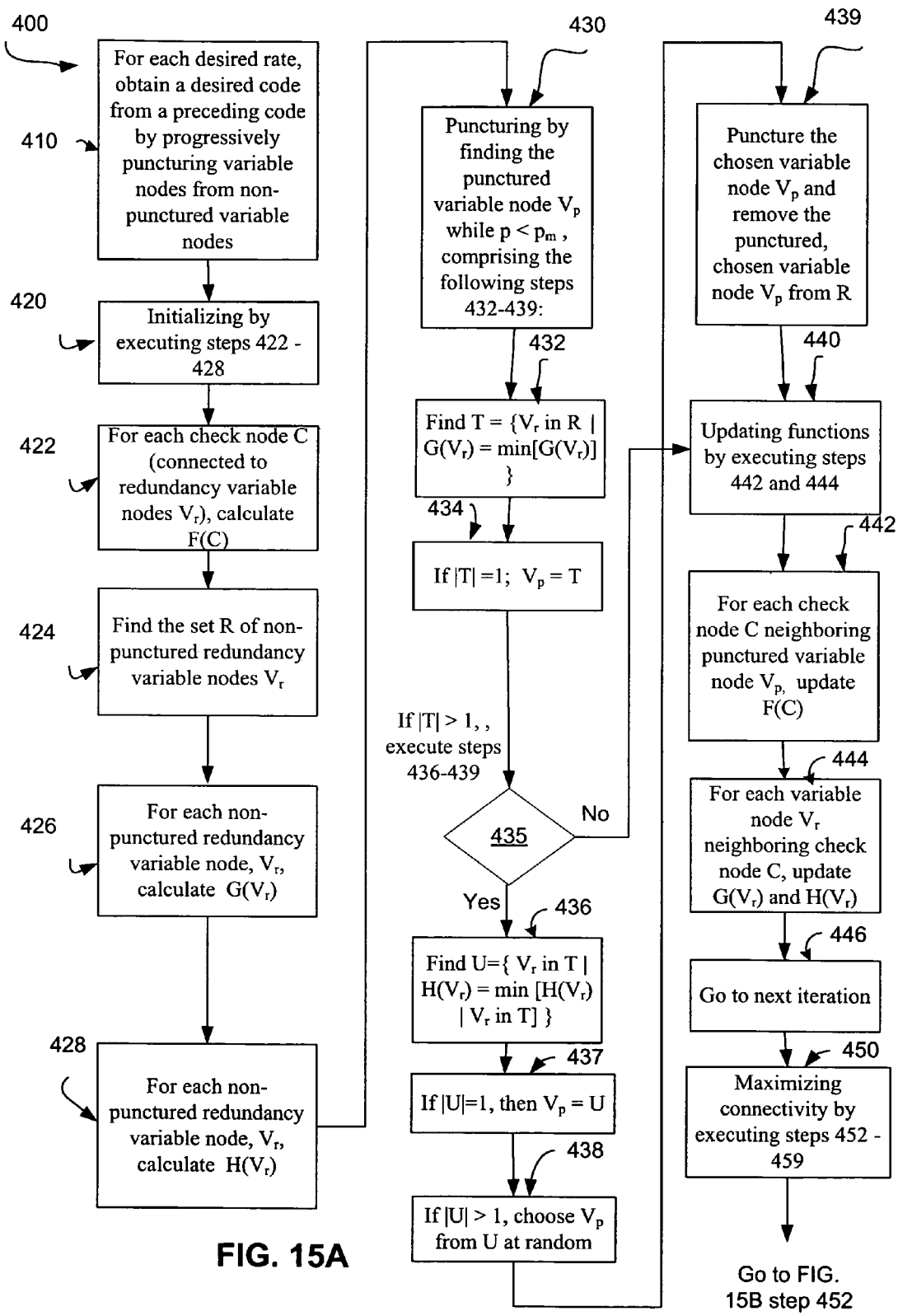
FIGS. 15A and 15B are flowcharts illustrating the steps executed in the progressive node puncturing method of the present patent application.
Figure 21A:
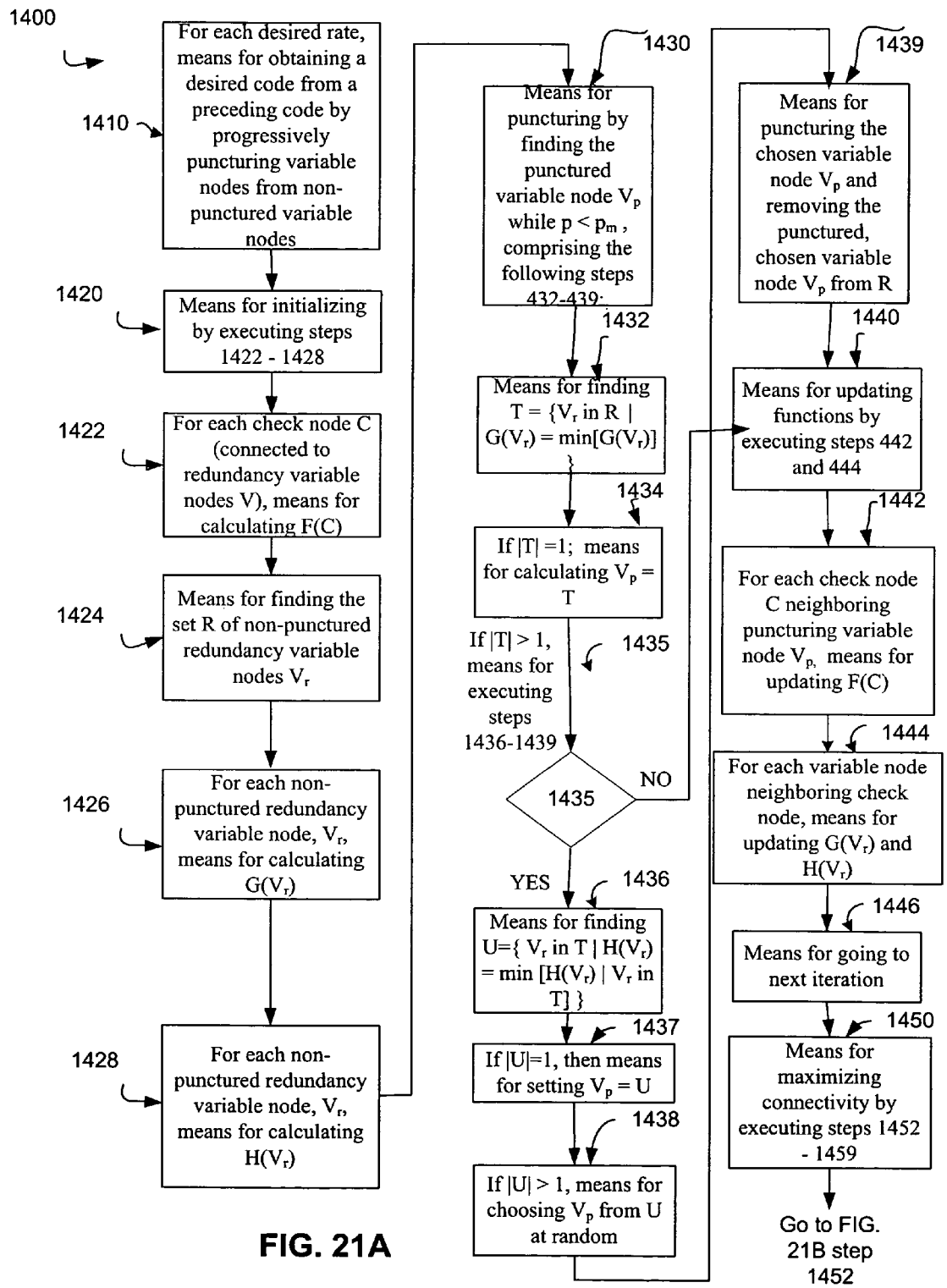
FIGS. 21A and 21B are functional block diagrams illustrating the steps executed in the progressive node puncturing method of the present patent application.
Figure 21B:
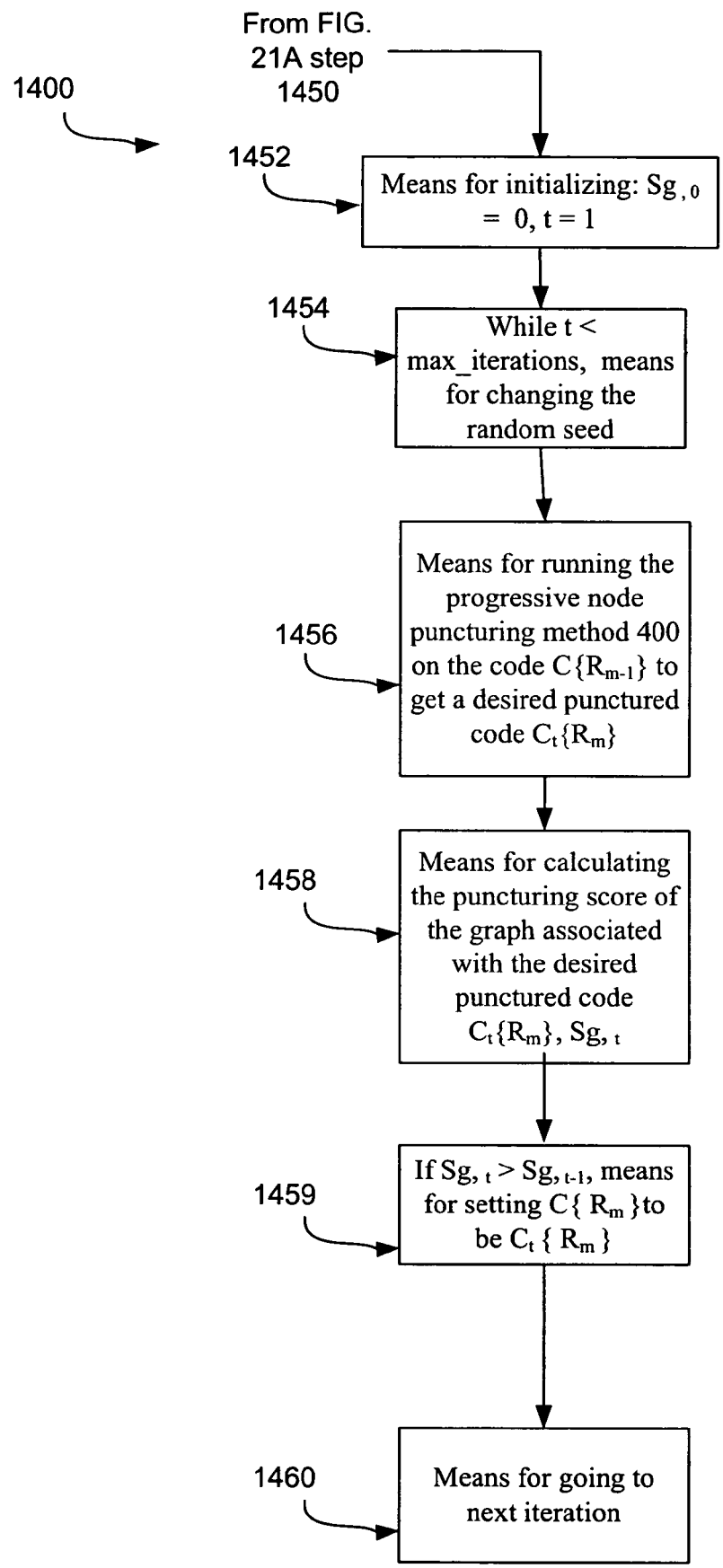

The methods and apparatuses of FIG. 15A described above are performed by corresponding means plus function blocks illustrated in FIG. 21. In other words, steps 400, 410, 420, 422, 424, 426, 428, 430, 432, 434, 435, 436, 437, 438, 439, 440, 442, 444, 446, and 450 in FIG. 15A correspond to means plus function blocks 1400, 1410, 1420, 1422, 1424, 1426, 1428, 1430, 1432, 1434, 1435, 1436, 1437, 1438, 1439, 1440, 1442, 1444, 1446, and 1450 in FIG. 21.

Figure 15B:
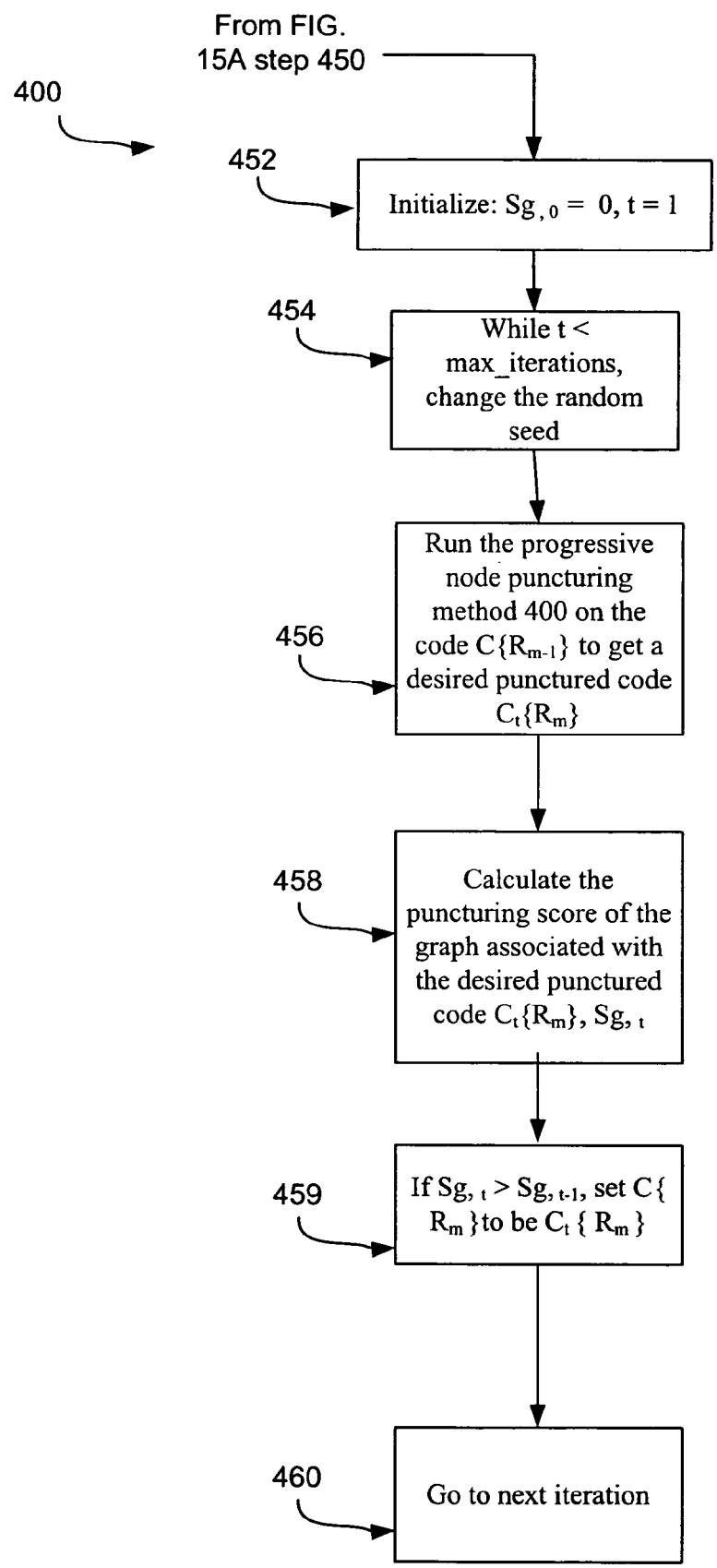

The methods and apparatuses of FIG. 15B described above are performed by corresponding means plus function blocks illustrated in FIG. 22. In other words, steps 452, 454, 456, 458, 459 and 460 in FIG. 15B correspond to means plus function blocks 1452, 1454, 1456, 1458, 1459 and 1460 in FIG. 22.

Those of skill in the art would understand that the data, instructions, commands, information, signals, bits, symbols, and chips that may be referenced throughout the above description are advantageously represented by voltages, currents, electromagnetic waves, magnetic fields or particles, optical fields or particles, or any combination thereof. Those of skill would further appreciate that the various illustrative logical blocks, modules, circuits, and algorithm steps described in connection with the embodiments disclosed herein may be implemented as electronic hardware, computer software, or combinations of both. The various illustrative components, blocks, modules, circuits, and steps have been described generally in terms of their functionality. Whether the functionality is implemented as hardware or software depends upon the particular application and design constraints imposed on the overall system. Skilled artisans recognize the interchangeability of hardware and software under these circumstances, and how best to implement the described functionality for each particular application. As examples, the various illustrative logical blocks, modules, circuits, and algorithm steps described in connection with the embodiments disclosed herein may be implemented or performed with a digital signal processor (DSP), an application specific integrated circuit (ASIC), a field programmable gate array (FPGA) or other programmable logic device, discrete gate or transistor logic, discrete hardware components such as, e.g., registers and FIFO, a processor executing a set of firmware instructions, any conventional programmable software module and a processor, or any combination thereof designed to perform the functions described herein. The processor may advantageously be a microprocessor, but in the alternative, the processor may be any conventional processor, controller, microcontroller, programmable logic device, array of logic elements, or state machine. The software module could reside in RAM memory, flash memory, ROM memory, EPROM memory, EEPROM memory, registers, hard disk, a removable disk, a CD-ROM, or any other form of storage medium known in the art. An exemplary processor is advantageously coupled to the storage medium so as to read information from, and write information to, the storage medium.

In the alternative, the storage medium may be integral to the processor. The processor and the storage medium may reside in an ASIC. The ASIC may reside in a telephone or other user terminal. In the alternative, the processor and the storage medium may reside in a telephone or other user terminal. The processor may be implemented as a combination of a DSP and a microprocessor, or as two microprocessors in conjunction with a DSP core, etc.

Preferred embodiments of the present invention have thus been shown and described. It would be apparent to one of ordinary skill in the art, however, that numerous alterations may be made to the embodiments herein disclosed without departing from the spirit or scope of the invention. Therefore, the present invention is not to be limited except in accordance with the following claims.

What is claimed is:

1. A method of generating low rate protographs from high rate protographs, comprising:
    copying a base graph;
    permuting end points of edges of a same type in copies of said base graph to produce a permuted graph; and
    pruning systematic input nodes in said permuted graph and said edges connected to them,
    wherein said step of permuting end points of edges of a same type in said copies of said base graph further comprises using a progressive edge growth method to maximize a girth of said base graph.

2. The method of claim 1, wherein said step of permuting end points of edges of a same type in said copies of said base graph further comprises establishing edges or connections between symbol and check nodes in an edge-by-edge manner.

3. The method of claim 1, wherein said step of pruning systematic input nodes further comprises: pruning (N−C)(m−2) systematic input nodes, where N represents a number of variable nodes, C represents a number of check nodes, and 1/m represents a desired base rate.

4. The method of claim 3, wherein said step of copying a base graph comprises copying said base graph m−1 times.

5. The method of claim 4, wherein said step of permuting end points of edges of a same type in said m−1 copies of said base graph further comprises:
    using a progressive edge growth method to maximize a girth of said base graph;
    repeating said step of permuting; and
    picking the permuted graph which has the smallest number of shortest cycles if the progressive edge method involves a random seed.

6. The method of claim 1, wherein said step of pruning systematic input nodes further comprises: pruning $$pK\frac{R_B - R_L}{R_B(1 - R_L)}$$

systematic input nodes and the edges connected to them, where p is the number of copies of the base graph, K is the number of variable nodes minus the number of check nodes, RB is the desired base rate and RL is the design rate.

7. The method of claim 1, further comprising optimizing said pruned input nodes by using a combination of adding, removing and swapping said edges of said pruned permuted graph.

8. The method of claim 1, wherein said step of permuting end points of edges of a same type in said copies of said base graph further comprises repeating said step of permuting.

9. The method of claim 1, wherein said progressive edge growth method is a circulant PEG method.

10. A means for generating low rate protographs from high rate protographs, comprising:
    means for copying a base graph;
    means for permuting end points of edges of a same type in copies of said base graph to produce a permuted graph; and
    means for pruning systematic input nodes in said permuted graph and said edges connected to them,
    wherein said means for permuting end points of edges of a same type in said copies of said base graph further comprises means for using a progressive edge growth method to maximize a girth of said base graph.

11. The means of claim 10, wherein said means for permuting end points of edges of a same type in said copies of said base graph further comprises means for establishing edges or connections between symbol and check nodes in an edge-by-edge manner.

12. The means of claim 10, wherein said means for pruning systematic input nodes further comprises means for pruning (N−C)(m−2) systematic input nodes, where N represents a number of variable nodes, C represents a number of check nodes and 1/m represents a desired base rate.

13. The means of claim 12, wherein said means for copying a base graph comprises means for copying said base graph m−1 times.

14. The means of claim 13, wherein said means for permuting end points of edges of a same type in said m−1 copies of said base graph further comprises:
    means for using a progressive edge growth method to maximize a girth of said base graph;
    means for repeating said permuting; and
    means for picking the permuted graph which has the smallest number of shortest cycles if the progressive edge method involves a random seed.

15. The means of claim 10, wherein said step of pruning systematic input nodes further comprises: pruning $$pK\frac{R_B - R_L}{R_B(1 - R_L)}$$

systematic input nodes and the edges connected to them, where p is the number of copies of the base graph, K is the number of variable nodes minus the number of check nodes, RB is the desired base rate and RL is the design rate.

16. The means of claim 10, further comprising optimizing said pruned input nodes by using a combination of adding, removing and swapping said edges of said pruned permuted graph.

17. The means of claim 10, wherein said means for permuting end points of edges of a same type in said copies of said base graph further comprises means for repeating said permuting.

18. The means of claim 10, wherein said progressive edge growth method is a circulant PEG method.

19. An encoder which generates low rate protographs from high rate protographs, comprising:
    a memory, wherein said encoder is adapted to execute software instructions stored in said memory comprising:
    copy a base graph;
    permute end points of edges of a same type in copies of said base graph to produce a permuted graph; and
    prune systematic input nodes in said permuted graph and said edges connected to them, wherein said instruction to permute end points of edges of a same type in said copies of said base graph further comprises use a progressive edge growth method to maximize a girth of said base graph.

20. The encoder of claim 19, wherein said instruction to permute end points of edges of a same type in said copies of said base graph further comprises establish edges or connections between symbol and check nodes in an edge-by-edge manner.

21. The encoder of claim 19, wherein said instruction to prune systematic input nodes further comprises prune (N–C)(m–2) systematic input nodes, where N represents a number of variable nodes, C represents a number of check nodes and 1/m represents a desired rate.

22. The encoder of claim 21, wherein said instruction to copy a base graph comprises copy said base graph m–1 times.

23. The encoder of claim 22, wherein said instruction to permute end points of edges of a same type in said m–1 copies of said base graph further comprises:
use a progressive edge growth method to maximize a girth of said base graph;
repeat said instruction to permute end points of edges of a same type in the copies of said base graph to produce a permuted graph; and
pick the permuted graph which has the smallest number of shortest cycles if the progressive edge method involves a random seed.

24. The encoder of claim 19, wherein said instruction to prune systematic input nodes further comprises: prune $$pK\frac{R_B - R_L}{R_B(1 - R_L)}$$

systematic input nodes and the edges connected to them, where p is the number of copies of the base graph, K is the number of variable nodes minus the number of check nodes, RB is the desired base rate and RL is the design rate.

25. The encoder of claim 19, further comprising an instruction to optimize said pruned input nodes by using a combination of adding, removing and swapping said edges of said pruned permuted graph.

26. The encoder of claim 19, wherein said instruction to permute end points of edges of a same type in said copies of said base graph further comprises repeat said instruction to permute end points of edges of a same type in the copies of said base graph to produce a permuted graph.

27. The encoder of claim 19, wherein said progressive edge growth method is a circulant PEG method.

28. An access terminal which generates low rate protographs from high rate protographs, comprising:
a transmitter;
a receiver operably connected to said transmitter;
a processor operably connected to said transmitter and said receiver;
an antenna operably connected to said transmitter and said receiver; and
a memory operably connected to said processor, wherein said access terminal is adapted to execute instructions stored in said memory comprising:
copy a base graph;
permute end points of edges of a same type in copies of said base graph to produce a permuted graph; and
prune systematic input nodes in said permuted graph and said edges connected to them,
wherein said instruction to permute end points of edges of a same type in said copies of said base graph further comprises use a progressive edge growth method to maximize a girth of said base graph.

29. The access terminal of claim 28, wherein said instruction to permute end points of edges of a same type in said copies of said base graph further comprises establish edges or connections between symbol and check nodes in an edge-by-edge manner.

30. The access terminal of claim 28, wherein said instruction to prune systematic input nodes further comprises prune (N–C)(m–2) systematic input nodes, where N represents a number of variable nodes, c represents a number of check nodes and 1/m is the desired rate.

31. The access terminal of claim 30, wherein said instruction to copy a base graph comprises copy said base graph m–1 times.

32. The access terminal of claim 31, wherein said instruction to permute end points of edges of a same type in said m–1 copies of said base graph further comprises:
use a progressive edge growth method to maximize a girth of said base graph;
repeat said instruction to permute end points of edges of a same type in the copies of said base graph to produce a permuted graph; and
pick the permuted graph which has the smallest number of shortest cycles if the progressive edge method involves a random seed.

33. The access terminal of claim 28, wherein said instruction to prune systematic input nodes further comprises: prune $$pK\frac{R_B - R_L}{R_B(1 - R_L)}$$

systematic input nodes and the edges connected to them, where p is the number of copies of the base graph, K is the number of variable nodes minus the number of check nodes, RB is the desired base rate and RL is the design rate.

34. The access terminal of claim 28, further comprising an instruction to optimize said pruned input nodes by using a combination of adding, removing and swapping said edges of said pruned permuted graph.

35. The access terminal of claim 28, wherein said instruction to permute end points of edges of a same type in said copies of said base graph further comprises repeat said instruction to permute end points of edges of a same type in the copies of said base graph to produce a permuted graph.

36. The access terminal of claim 28, wherein said progressive edge growth method is a circulant PEG method.

* * * * *